United States Patent
Oh et al.

(10) Patent No.: US 10,558,382 B2
(45) Date of Patent: Feb. 11, 2020

(54) MEMORY SYSTEM AND OPERATING METHOD THEREOF

(71) Applicant: SK hynix Inc., Gyeonggi-do (KR)

(72) Inventors: Ik-Sung Oh, Gyeonggi-do (KR);
Kyeong-Rho Kim, Gyeonggi-do (KR);
Sung-Kwan Hong, Seoul (KR);
Jin-Woong Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/186,265

(22) Filed: Nov. 9, 2018

(65) Prior Publication Data

US 2019/0310774 A1    Oct. 10, 2019

(30) Foreign Application Priority Data

Apr. 9, 2018  (KR) .................. 10-2018-0041143

(51) Int. Cl.
*G11C 8/12*   (2006.01)
*G06F 3/06*   (2006.01)
*G11C 29/00*  (2006.01)

(52) U.S. Cl.
CPC .......... *G06F 3/064* (2013.01); *G06F 3/0604* (2013.01); *G06F 3/0647* (2013.01); *G06F 3/0673* (2013.01); *G11C 8/12* (2013.01); *G11C 29/886* (2013.01)

(58) Field of Classification Search
CPC ...... G11C 29/883; G11C 29/886; G11C 29/04

USPC ............... 365/200, 230.03, 230.06
See application file for complete search history.

(56) References Cited

U.S. PATENT DOCUMENTS

| | | | | |
|---|---|---|---|---|
| 2012/0124304 A1* | 5/2012 | Asnaashari | ......... | G06F 12/0246 711/159 |
| 2013/0073789 A1* | 3/2013 | Khmelnitsky | ...... | G06F 12/0246 711/103 |
| 2016/0103734 A1 | 4/2016 | Chen et al. | | |
| 2019/0129841 A1* | 5/2019 | Kanno | ................ | G06F 12/0246 |

FOREIGN PATENT DOCUMENTS

KR   1020170012674   2/2017

* cited by examiner

*Primary Examiner* — Han Yang
(74) *Attorney, Agent, or Firm* — IP & T Group LLP

(57) ABSTRACT

A memory system may include: a memory device including a plurality of memory blocks; and a controller suitable for grouping the memory blocks based on type into a plurality of super blocks according to a preset condition and managing the memory blocks by managing the super blocks, the controller may manage one or more of the super blocks, in each of which at least one bad memory block and good memory blocks are grouped, by classifying the one or more superblocks as first super blocks, and the controller may differently manage uses of the respective first super blocks based on the numbers of bad memory blocks included in the respective first super blocks.

20 Claims, 14 Drawing Sheets

MEMORY SYSTEM AND OPERATING METHOD THEREOF

CROSS-REFERENCE TO RELATED APPLICATION

This application claims priority under 35 U.S.C. § 119(a) to Korean Patent Application No. 10-2018-0041143, filed on Apr. 9, 2018, which is incorporated herein by reference in its entirety.

BACKGROUND

1. Field

Various embodiments relate to a memory system, and more particularly, to a memory system including a nonvolatile memory device and an operating method thereof.

2. Discussion of the Related Art

The computer environment paradigm has changed to ubiquitous computing systems that can be used anytime and anywhere. Due to this, use of portable electronic devices such as mobile phones, digital cameras, and notebook computers has rapidly increased. These portable electronic devices generally use a memory system having one or more memory devices for storing data. A memory system may be used as a main or an auxiliary storage device of a portable electronic device.

Memory systems provide excellent stability, durability, high information access speed, and low power consumption because they have no moving parts. Examples of memory systems having such advantages include universal serial bus (USB) memory devices, memory cards having various interfaces, and solid state drives (SSD).

SUMMARY

Various embodiments are directed to a memory system and an operating method thereof, capable of managing a plurality of memory blocks included in a memory device, by grouping them into a super memory block.

In an embodiment, a memory system may include: a memory device including a plurality of memory blocks; and a controller suitable for grouping the memory blocks based on type into a plurality of super blocks according to a preset condition and managing the memory blocks by managing the super blocks, the controller may manage one or more of the super blocks, in each of which at least one bad memory block and good memory blocks are grouped, by classifying the one or more superblocks as first super blocks, and the controller may differently manage uses of the respective first super blocks based on the numbers of bad memory blocks included in the respective first super blocks.

The controller may manage remaining super blocks in each of which only good memory blocks are grouped, by classifying them as second super blocks, among the plurality of super blocks, the controller may manage first super blocks, each of which includes a number of bad memory which is equal to or less than a preset number, among the first super blocks, by classifying them as third super blocks, and the controller may manage first super blocks, each of which includes a number of bad memory blocks which exceeds the preset number, among the first super blocks, by classifying them as fourth super blocks.

The controller may store normal write data in the second super blocks, the controller may store map data of the stored write data in the third super blocks, and the controller may store log data representing accesses to the memory blocks in the fourth super blocks.

The controller may store data to be written during a foreground operation in the second super blocks, the controller may store data to be written during a background operation in the third super blocks, and the controller may store log data representing accesses to the memory blocks in the fourth super blocks.

The controller may program memory cells in the second super blocks in a program scheme for a multi-level cell, and the controller may program memory cells in the third super blocks and the fourth super blocks in a program scheme for a single level cell.

The controller may program memory cells in the second super blocks in a program scheme for a triple level cell, the controller may program memory cells in the third super blocks in a program scheme for a multi-level cell, and the controller may program memory cells in the fourth super blocks in a program scheme for a single level cell.

The controller may manage good/bad states of memory blocks in the third and fourth super blocks by a state bitmap, and when storing data in the third or fourth super blocks, the controller may store the data in only good memory blocks of each of the third or fourth super blocks, which are identified by checking the state bitmap.

In the case where at least one bad memory block is present in a select second super block among the second super blocks due to repetition of erase-write cycles, the controller may move valid data stored in the select second super block, to a target super block, through a merge operation, and then, may manage the select second super block as a third or fourth super block.

A first die, of dies in the memory device, may be coupled to a first channel, a second die of the dies may be coupled to a second channel, planes included in the first die may be coupled to a plurality of first ways which share the first channel, and planes included in the second die may be coupled to a plurality of second ways which share the second channel.

The grouping of the memory blocks, by the controller, based on type into a plurality of super blocks according to the preset condition may include: grouping a first block which is in a first plane of the first die and a second block which is in a second plane of the first die, and grouping a third block which is in a third plane of the second die and a fourth block which is in a fourth plane of the second die, grouping a first block which is in a first plane of the first die and a third block which is in a third plane of the second die, and grouping a second block which is in a second plane of the first die and a fourth block which is in a fourth plane of the second di, or grouping a first block which is in a first plane of the first die, a second block which is in a second plane of the first die, a third block which is in a third plane of the second die and a fourth block which is in a fourth plane of the second die.

In an embodiment, a method for operating a memory system including a memory device including a plurality of memory blocks, the method may include: grouping the memory blocks based on type into a plurality of super blocks according to a preset condition, and managing the memory blocks by managing the super blocks; managing one or more super blocks, in each of which at least one bad memory block and good memory blocks are grouped, by classifying them as first super blocks; and differently managing uses of the respective first super blocks based on the numbers of bad memory blocks included in the respective first super blocks.

The method may further include managing remaining super blocks, in each of which only good memory blocks are grouped, by classifying them as second super blocks, among the plurality of super blocks, the managing of the remaining super blocks may include: managing first super blocks, each of which includes a number of bad memory blocks which is equal to or less than a preset number, among the first super blocks, by classifying them as third super blocks; and managing first super blocks, each of which includes a number of bad memory blocks which exceeds the preset number, among the first super blocks, by classifying them as fourth super blocks.

The method may further include: storing normal write data in the second super blocks; storing map data of the stored write data in the third super blocks; and storing log data representing accesses to the memory blocks in the fourth super blocks.

The method may further include: storing data to be written during a foreground operation in the second super blocks; storing data to be written during a background operation in the third super blocks; and storing log data representing accesses to the memory blocks in the fourth super blocks.

The method may further include: programming memory cells in the second super blocks in a program scheme for a multi-level cell; and programming memory cells in the third super blocks and the fourth super blocks in a program scheme for a single level cell.

The method may further include: programming memory cells in the second super blocks in a program scheme for a triple level cell, programming memory cells in the third super blocks in a program scheme for a multi-level cell, and programming memory cells in the fourth super blocks, in a program scheme for a single level cell.

The method may further include: managing good/bad states of memory blocks in each of the third and fourth super blocks by a state bitmap; and storing, when storing data in the third or fourth super blocks, the data in only good memory blocks of each of the third or fourth super blocks, which are identified by checking the state bitmap.

The method may further include moving, when at least one bad memory block is present in a select second super block among the second super blocks due to repetition of erase-write cycles, valid data stored in the select second super block, to a target super block, through a merge operation, and then, managing the select second super block by classifying it as a third or fourth super block.

A first die, of dies in the memory device, may be coupled to a first channel, a second die of the dies may be coupled to a second channel, planes included in the first die may be coupled to a plurality of first ways which share the first channel, and planes included in the second die may be coupled to a plurality of second ways which share the second channel.

The grouping according to the preset condition may include: grouping a first block which is in a first plane of the first die and a second block which is in a second plane of the first die, and grouping a third block which is in a third plane of the second die and a fourth block which is in a fourth plane of the second die; grouping a first block which is in a first plane of the first die and a third block which is in a third plane of the second die, and grouping a second block which is in a second plane of the first die and a fourth block which is in a fourth plane of the second die; or grouping a first block which is in a first plane of the first die, a second block which is in a second plane of the first die, a third block which is in a third plane of the second die and a fourth block which is in a fourth plane of the second die.

In an embodiment, a memory system may include: a memory device including first super block having one or more bad memory blocks and a second super block having only normal memory blocks; and a controller suitable for controlling the memory device to program data into the first and second super blocks, the controller may control the memory device to program data into normal memory blocks in the first and second super blocks according to a bitmap table identifying the bad memory blocks in the first and second super blocks, and the controller may control the memory device to program a first type of data into the first super block according to a first program scheme and to program a second type of data into the second super block according to a second program scheme.

BRIEF DESCRIPTION OF THE DRAWINGS

These and other features and advantages of the present invention will become apparent to those skilled in the art to which the present invention pertains from the following detailed description in reference to the accompanying drawings, wherein.

DETAILED DESCRIPTION

Figure 1:
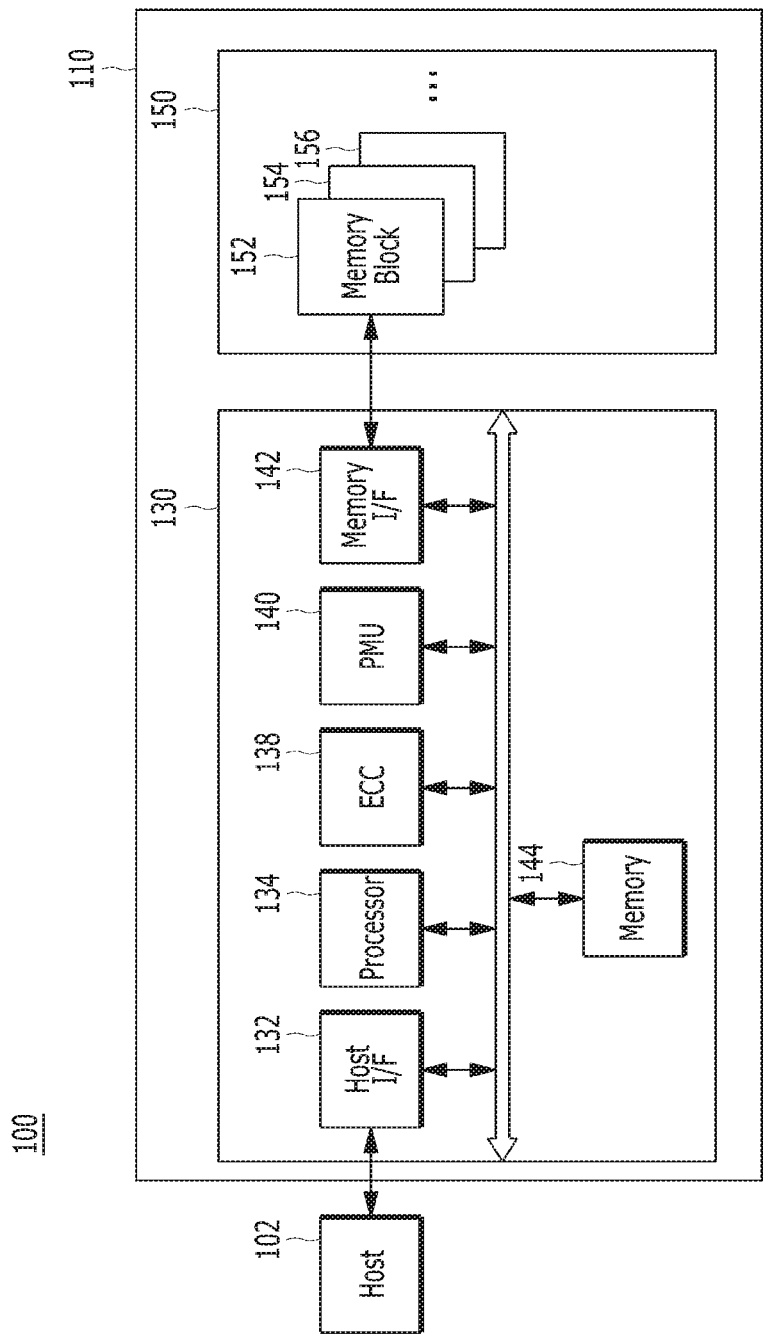
FIG. 1 is a block diagram illustrating a data processing system including a memory system in accordance with an embodiment of the present invention.

Various embodiments of the present invention are described below in more detail with reference to the accompanying drawings. We note, however, that the present invention may be embodied in different forms including variations of any of the disclosed embodiments. Thus, the present invention is not limited to the embodiments set forth herein. Rather, the described embodiments are provided so that this disclosure is thorough and complete and fully conveys the present invention to those skilled in the art to which this invention pertains. Throughout the disclosure, like reference numerals refer to like parts throughout the various figures and embodiments of the present invention. Also, throughout the specification, reference to "an embodiment," "another embodiment," or the like is not necessarily to only one embodiment, and different references to any such phrase are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. Thus, a first element in one instance could be termed a second or third element in another instance without departing from the spirit and scope of the present invention.

The drawings are not necessarily to scale and, in some instances, proportions may have been exaggerated in order to clearly illustrate features of the embodiments.

It will be further understood that when an element is referred to as being "connected to", "coupled to," or in "communication with" another element, such connection, coupling or communication may be wired or wireless, and also may be direct or indirect, i.e., through one or more intervening elements, unless stated, or the context requires otherwise. In addition, it will also be understood that when an element is referred to as being "between" two elements, it may be the only element between the two elements, or one or more intervening elements may also be present.

The terminology used herein is for the purpose of describing particular embodiments and is not intended to be limiting of the present invention. As used herein, singular forms are intended to include the plural forms and vice versa, unless the context clearly indicates otherwise. It will be further understood that the terms "comprises," "comprising," "includes," and "including" when used in this specification, specify the presence of the stated elements but do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 including a memory system 110 in accordance with an embodiment of the present invention.

Referring to FIG. 1, the data processing system 100 may include a host 102 and the memory system 110.

The host 102 may be implemented as any of a variety of portable electronic devices such as a mobile phone, MP3 player and laptop computer or as any of a variety of non-portable electronic devices such as a desktop computer, game machine, TV and projector.

The memory system 110 may operate to store data for the host 102 in response to a request of the host 102. Non-limiting examples of the memory system 110 include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and micro-MMC. The SD card may include a mini-SD card and micro-SD card.

The memory system 110 may be embodied by any of various types of storage devices. Non-limiting examples of storage devices in the memory system 110 include volatile memory devices such as a DRAM dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM) and a flash memory. The flash memory may have a 3-dimensioanl (3D) stack structure.

The memory system 110 may include a memory device 150 and a controller 130. The memory device 150 may store data for the host 120, and the controller 130 may control data storage into the memory device 150.

The controller 130 and the memory device 150 may be integrated into a single semiconductor device, which may be implemented as any of the various types of memory systems exemplified above.

Non-limiting application examples of the memory system 110 include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device that retains data stored therein even though power is not supplied. The memory device 150 may store data provided from the host 102 through a write operation, and provide data stored therein to the host 102 through a read operation. The memory device 150 may include a plurality of memory dies (not shown), each memory die including a plurality of planes (not shown), each plane including a plurality of memory blocks 152 to 156, each of which may include a plurality of pages. Each of the pages may include a plurality of memory cells coupled to a word line.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program and erase operations of the memory device 150.

The controller 130 may include a host interface (I/F) 132, a processor 134, an error correction code (ECC) component 138, a Power Management Unit (PMU) 140, a NAND flash controller (NFC) 142 and a memory 144, all operatively coupled via an internal bus.

The host interface 132 may be configured to process a command and data of the host 102, and may communicate with the host 102 through one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (PATA), enhanced small disk interface (ESDI) and integrated drive electronics (IDE).

The ECC component 138 may detect and correct an error contained in the data read from the memory device 150. In other words, the ECC component 138 may perform an error correction decoding process to the data read from the memory device 150 through an ECC code used during an ECC encoding process. According to a result of the error correction decoding process, the ECC component 138 may output a signal, for example, an error correction success/fail signal. When the number of error bits is more than a threshold value of correctable error bits, the ECC component 138 may not correct the error bits, and instead may output an error correction fail signal.

The ECC component 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC component 138 is not limited to these correction techniques. As such, the ECC component 138 may include all circuits, modules, systems or devices for suitable error correction.

The PMU 140 may provide and manage power of the controller 130.

The NFC 142 may serve as a memory/storage interface for interfacing the controller 130 and the memory device 150 such that the controller 130 controls the memory device 150 in response to a request from the host 102. When the memory device 150 is a flash memory or specifically a NAND flash memory, the NFC 142 may generate a control signal for the memory device 150 and process data to be provided to the memory device 150 under the control of the processor 134. The NFC 142 may work as an interface (e.g., a NAND flash interface) for processing a command and data between the controller 130 and the memory device 150. Specifically, the NFC 142 may support data transfer between the controller 130 and the memory device 150.

The memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by static random access memory (SRAM) or dynamic random access memory (DRAM). The memory 144 may be disposed within or externally to the controller 130. FIG. 1 shows the memory 144 disposed within the controller 130. However, in another embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL).

The processor 134 of the controller 130 may include a management unit (not illustrated) for performing a bad management operation of the memory device 150. The management unit may perform a bad block management operation of identifying a block in which a program fail occurs due to the characteristic of a NAND flash memory during a program operation (i.e., a bad block), among the plurality of memory blocks 152 to 156 in the memory device 150. The management unit may write the program-failed data of the bad block to a new memory block. In the memory device 150 having a 3D stack structure, the bad block management operation may reduce the use efficiency of the memory device 150 and the reliability of the memory system 110. Thus, the bad block management operation needs to be performed with more reliability.

Figure 2:
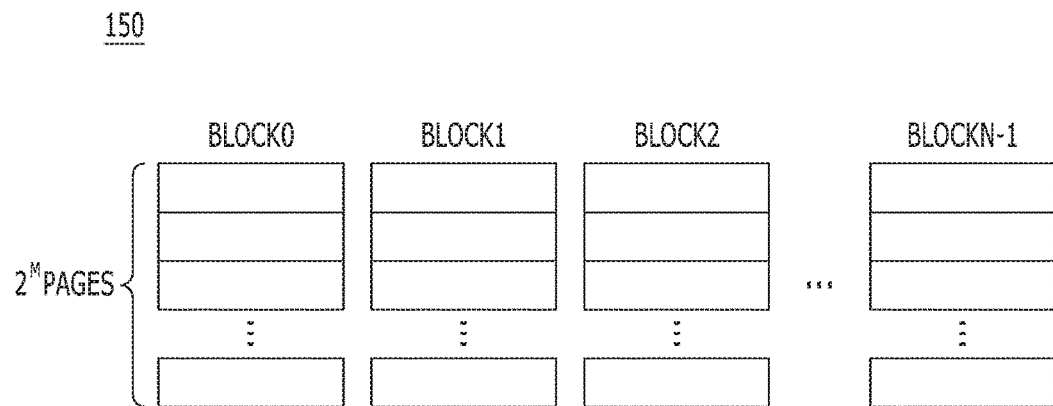
FIG. 2 is a schematic diagram illustrating an exemplary configuration of a memory device employed in the memory system shown in FIG. 1.

FIG. 2 is a schematic diagram illustrating an exemplary configuration of the memory device 150.

Referring to FIG. 2, the memory device 150 may include a plurality of memory blocks 0 to N−1, and each of the blocks 0 to N−1 may include a plurality of pages, for example, $2^M$ pages, the number of which may vary according to circuit design. Memory cells in the respective memory blocks 0 to N−1 may be one or more of a single level cell (SLC) storing 1-bit data, or a multi-level cell (MLC) storing 2- or more bit data. In an embodiment, the memory device 150 may include a plurality of triple level cells (TLC) each storing 3-bit data. In another embodiment, the memory device may include a plurality of quadruple level cells (QLC) each storing 4-bit level cell.

Figure 3:
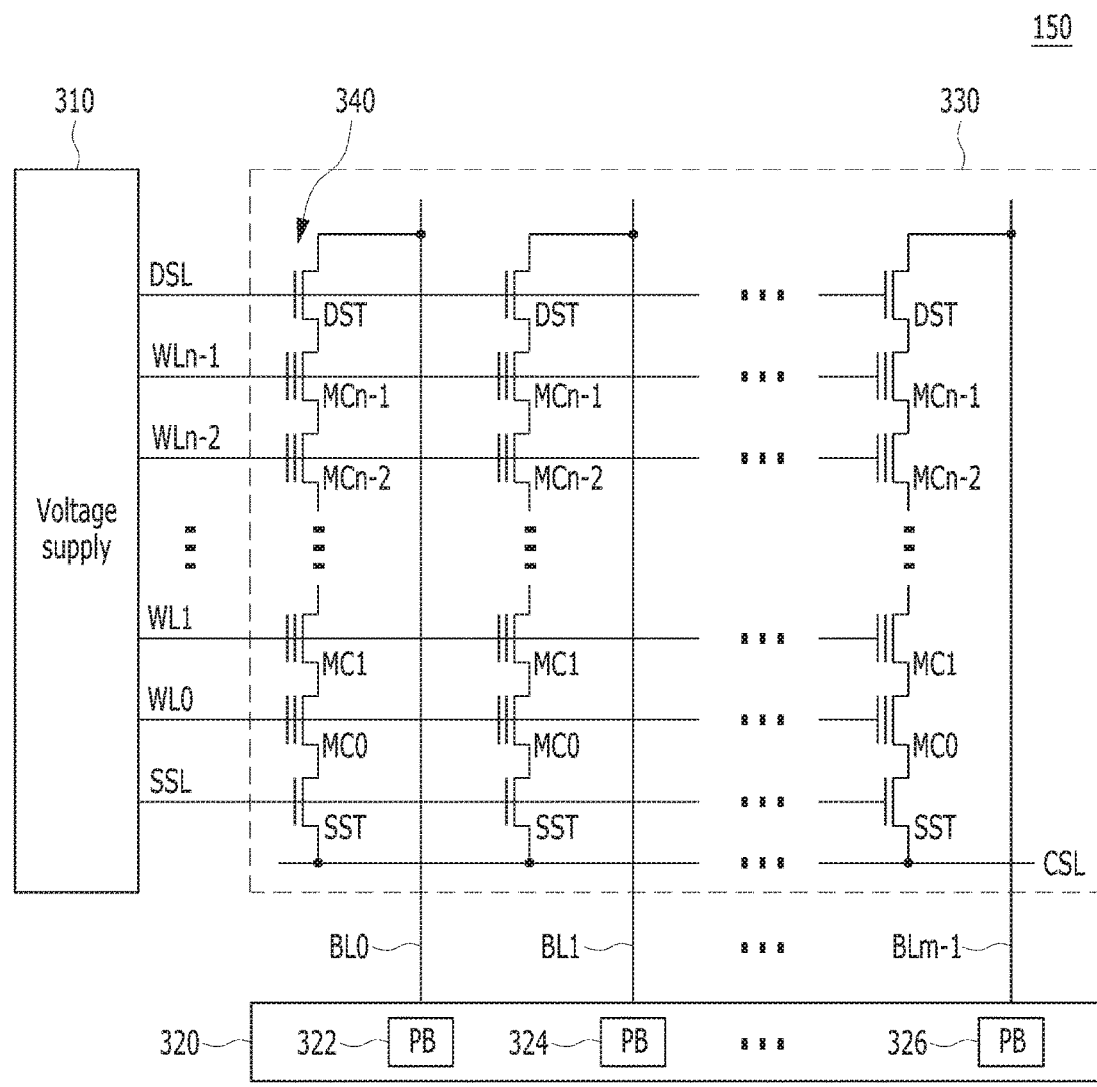
FIG. 3 is a circuit diagram illustrating an exemplary configuration of a memory cell array of a memory block in the memory device shown in FIG. 2.

FIG. 3 is a circuit diagram illustrating an exemplary configuration of a memory cell array of a memory block in the memory device 150.

Referring to FIG. 3, a memory block 330, which may correspond to any of the plurality of memory blocks 152 to 156 in the memory device 150 of the memory system 110, may include a plurality of cell strings 340 coupled to a plurality of corresponding bit lines BL0 to BLm−1. The cell string 340 of each column may include one or more drain select transistors DST and one or more source select transistors SST. Between the drain and source select transistors DST and SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1.

Although FIG. 3 illustrates NAND flash memory cells, the invention is not limited to this configuration. The memory cells may be NOR flash memory cells, or hybrid flash memory cells including two or more kinds of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply 310 which provides word line voltages including a program voltage, a read voltage and a pass voltage to supply to the word lines according to an operation mode. The voltage generation operation of the voltage supply 310 may be controlled by a control circuit (not illustrated). Under the control of the control circuit, the voltage supply 310 may select one of the memory blocks (or sectors) of the memory cell array, select one of the word lines of the selected memory block, and provide the word line voltages to the selected word line and the unselected word lines as may be needed.

The memory device 150 may include a read/write circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
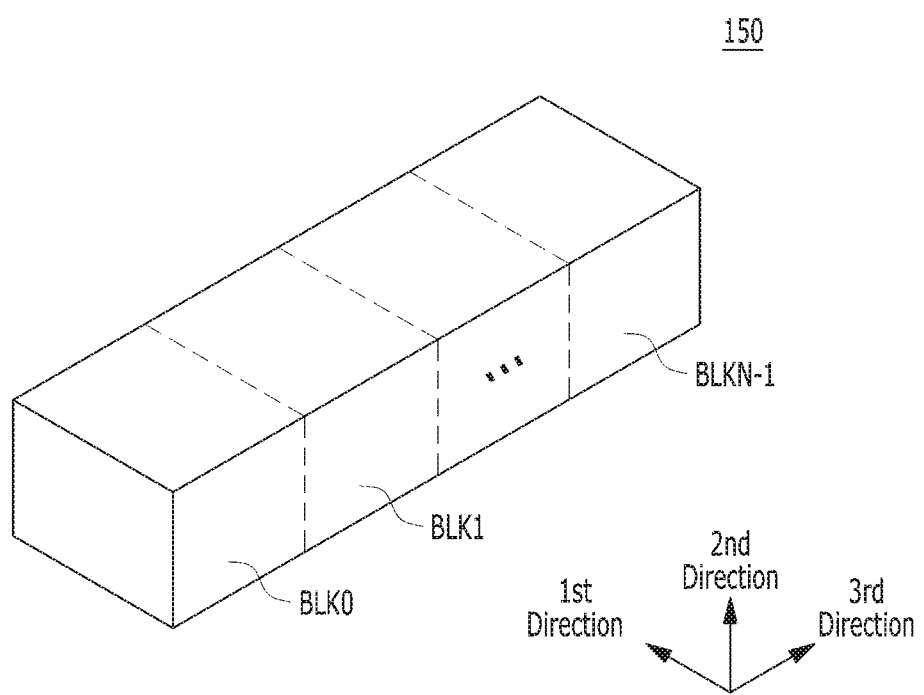
FIG. 4 is a schematic diagram illustrating an exemplary three-dimensional structure of the memory device shown in FIG. 2.

FIG. 4 is a schematic diagram illustrating an exemplary 3D structure of the memory device 150.

The memory device 150 may be embodied by a 2D or 3D memory device. Specifically, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1 each having a 3D structure (or vertical structure).

Figure 5:
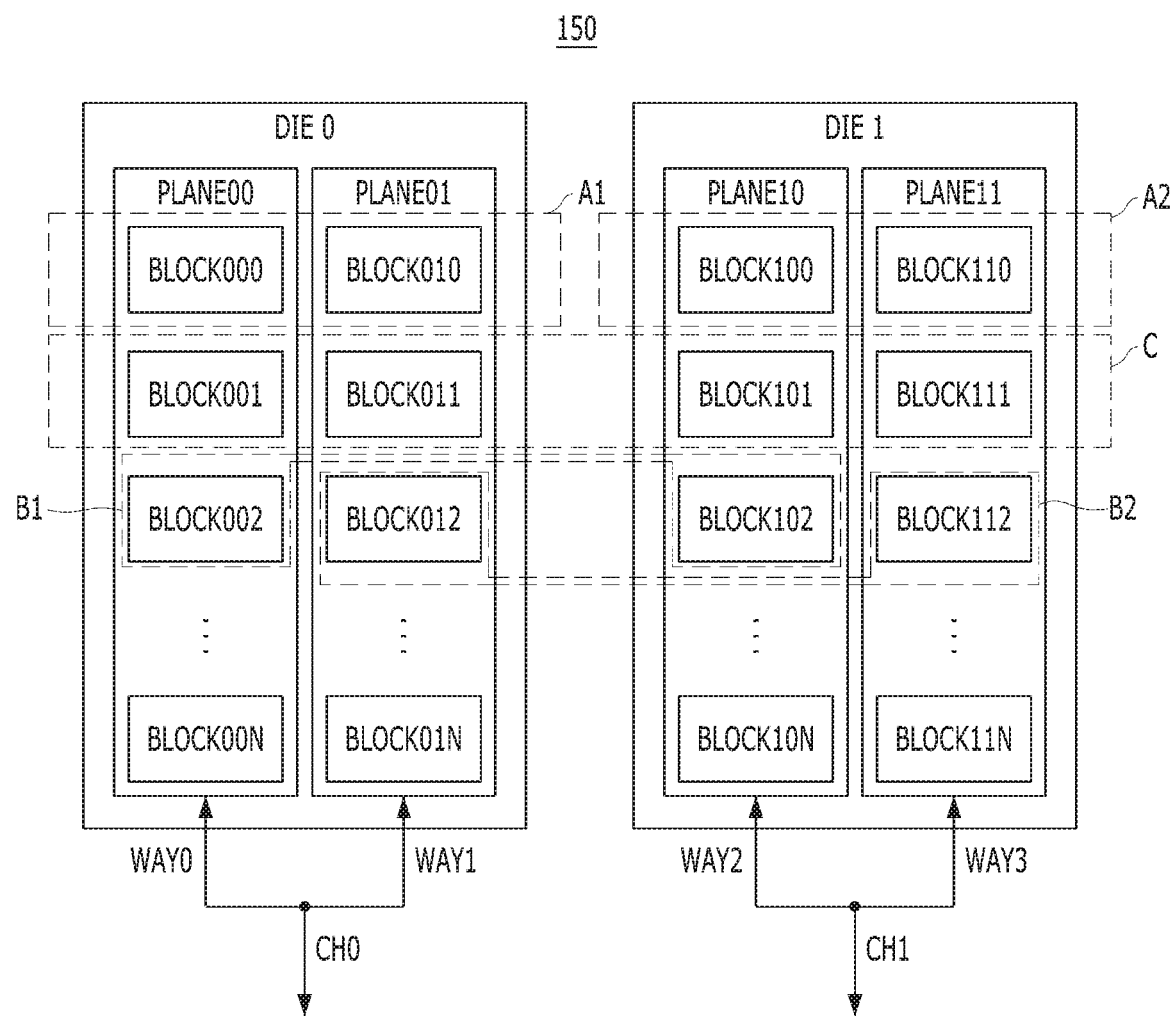
FIG. 5 is a diagram to assist in the explanation of the concept of a super memory block used in a memory system in accordance with an embodiment of the present invention.

FIG. 5 is a diagram to assist in the explanation of the concept of a super memory block used in a memory system in accordance with an embodiment of the present invention.

Referring to FIG. 5, it may be seen that the memory device 150 includes, among other components, an arrangement of dies, planes and memory blocks.

The memory device 150 includes a plurality of memory blocks BLOCK000, BLOCK001, BLOCK002, . . . and BLCOK00N, BLOCK010, BLOCK011, BLOCK012, . . . and BLCOK01N, BLOCK100, BLOCK101, BLOCK102, . . . and BLCOK10N, and BLOCK110, BLOCK111, BLOCK112, . . . and BLCOK11N.

The memory device 150 includes a zeroth memory die DIE0 capable of inputting/outputting data through a zeroth channel CH0 and a first memory die DIE1 capable of inputting/outputting data through a first channel CH1. The zeroth channel CH0 and the first channel CH1 may input/output data in an interleaving scheme.

The zeroth memory die DIE0 includes a plurality of planes PLANE00 and PLANE01 respectively corresponding to a plurality of ways WAY0 and WAY1 capable of inputting/outputting data in the interleaving scheme by sharing the zeroth channel CH0.

The first memory die DIE1 includes a plurality of planes PLANE10 and PLANE11 respectively corresponding to a plurality of ways WAY2 and WAY3 capable of inputting/outputting data in the interleaving scheme by sharing the first channel CH1.

The first plane PLANE00 of the zeroth memory die DIE0 includes a set or predetermined number of memory blocks, i.e., BLOCK000, BLOCK001, BLOCK002, . . . and BLCOK00N, among all of the plurality of memory blocks BLOCK000, BLOCK001, BLOCK002, . . . and BLCOK00N, BLOCK010, BLOCK011, BLOCK012, . . . and BLCOK01N, BLOCK100, BLOCK101, BLOCK102, . . . and BLCOK10N, and BLOCK110, BLOCK111, BLOCK112, . . . and BLCOK11N.

The second plane PLANE01 of the zeroth memory die DIE0 includes the set or predetermined number of memory blocks, which in this case are BLOCK010, BLOCK011, BLOCK012, . . . and BLCOK01N, among all of the plurality of memory blocks.

The first plane PLANE10 of the first memory die DIE1 includes the set or predetermined number of memory blocks, which in this case are BLOCK100, BLOCK101, BLOCK102, . . . and BLCOK10N, among all of the plurality of memory blocks.

The second plane PLANE11 of the first memory die DIE1 includes the set or predetermined number of memory blocks, which in this case are BLOCK110, BLOCK111, BLOCK112, . . . and BLCOK11N, among all of the plurality of memory blocks.

In this manner, the plurality of memory blocks in the memory device 150 may be divided according to physical positions such that blocks in the same plane use the same way and blocks in the same die use the same channel.

While it is illustrated in FIG. 5 that the memory device 150 includes two dies, each of which include two planes, this is merely an example. The number of memory dies in the memory device 150 may be any suitable number based on design and operational considerations, and the number of planes in each memory die may likewise be different than in the example shown in FIG. 5. Of course, the set or predetermined number of memory blocks in each plane also may be different depending on design and operational considerations.

Also, different from dividing the memory blocks according to physical positions, the controller 130 may use a scheme of dividing the memory blocks according to simultaneous selection and operation of memory blocks. That is to say, the controller 130 may manage a plurality of memory blocks by grouping memory blocks capable of being selected simultaneously and thereby dividing the plurality of memory blocks into super memory blocks.

The plurality of memory blocks into super memory blocks by the controller 130 may be divided according to various schemes depending on design considerations, and three schemes will be described herein.

A first scheme is to create and manage one super memory block A1 by grouping, using the controller 130, one memory block BLOCK000 in the first plane PLANE00 and one memory block BLOCK010 in the second plane PLANE01 of the zeroth memory die DIE0 in the memory device 150. When applying the first scheme to the first memory die DIE1, the controller 130 may create and manage one super memory block A2 by grouping one memory block BLOCK100 in the first plane PLANE10 and one memory block BLOCK110 in the second plane PLANE11 of the first memory die DIE1.

In a second scheme one super memory block B1 is created and managed by the controller 130 to include memory block BLOCK002 in the first plane PLANE00 of the zeroth memory die DIE0 and one memory block BLOCK102 in the first plane PLANE10 of the first memory die DIE1. When applying the second scheme again, the controller 130 may create and manage one super memory block B2 by grouping one memory block BLOCK012 in the second plane PLANE01 of the zeroth memory die DIE0 and one memory block BLOCK112 in the second plane PLANE11 of the first memory die DIE1. Thus, while the first scheme groups two memory blocks from two different planes in the same die into a super block, the second scheme groups one block from each of the different dies into a super block. The methodology of either scheme may be extended to apply to arrangements of more than two dies and more than two planes in a die.

A third scheme is to create and manage one super memory block C by grouping, using the controller 130, one memory block BLOCK001 in the first plane PLANE00 of the zeroth memory die DIE0, one memory block BLOCK011 in the second plane PLANE01 of the zeroth memory die DIE0, one memory block BLOCK101 in the first plane PLANE10 of the first memory die DIE1, and one memory block BLOCK111 included in the second plane PLANE11 of the first memory die DIE1. Thus, in the third scheme two blocks, one from each plane in each die is grouped to form a super block. As is the case with the first and second schemes, the third scheme may also be extended to apply to more complex die/plane arrangements, as is further described below.

Memory blocks capable of being selected simultaneously by being included in the same super memory block may be selected substantially simultaneously through an interleaving scheme, for example, a channel interleaving scheme, a memory die interleaving scheme, a memory chip interleaving scheme or a way interleaving scheme.

Figure 6A:
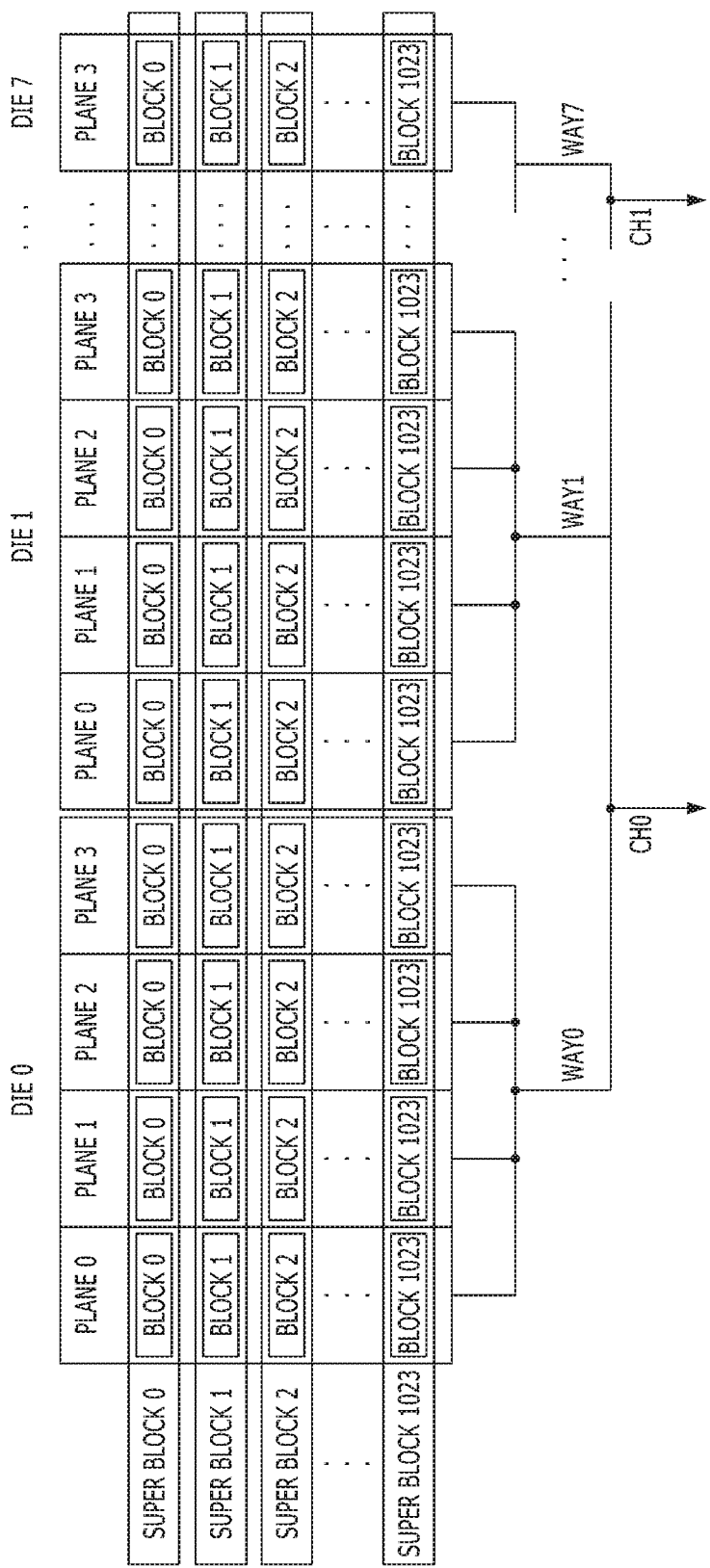
FIGS. 6A and 6B are diagrams to assist in the explanation of an operation of managing memory blocks by the unit of super memory block in the memory system in accordance with an embodiment of the present invention.
Figure 6B:
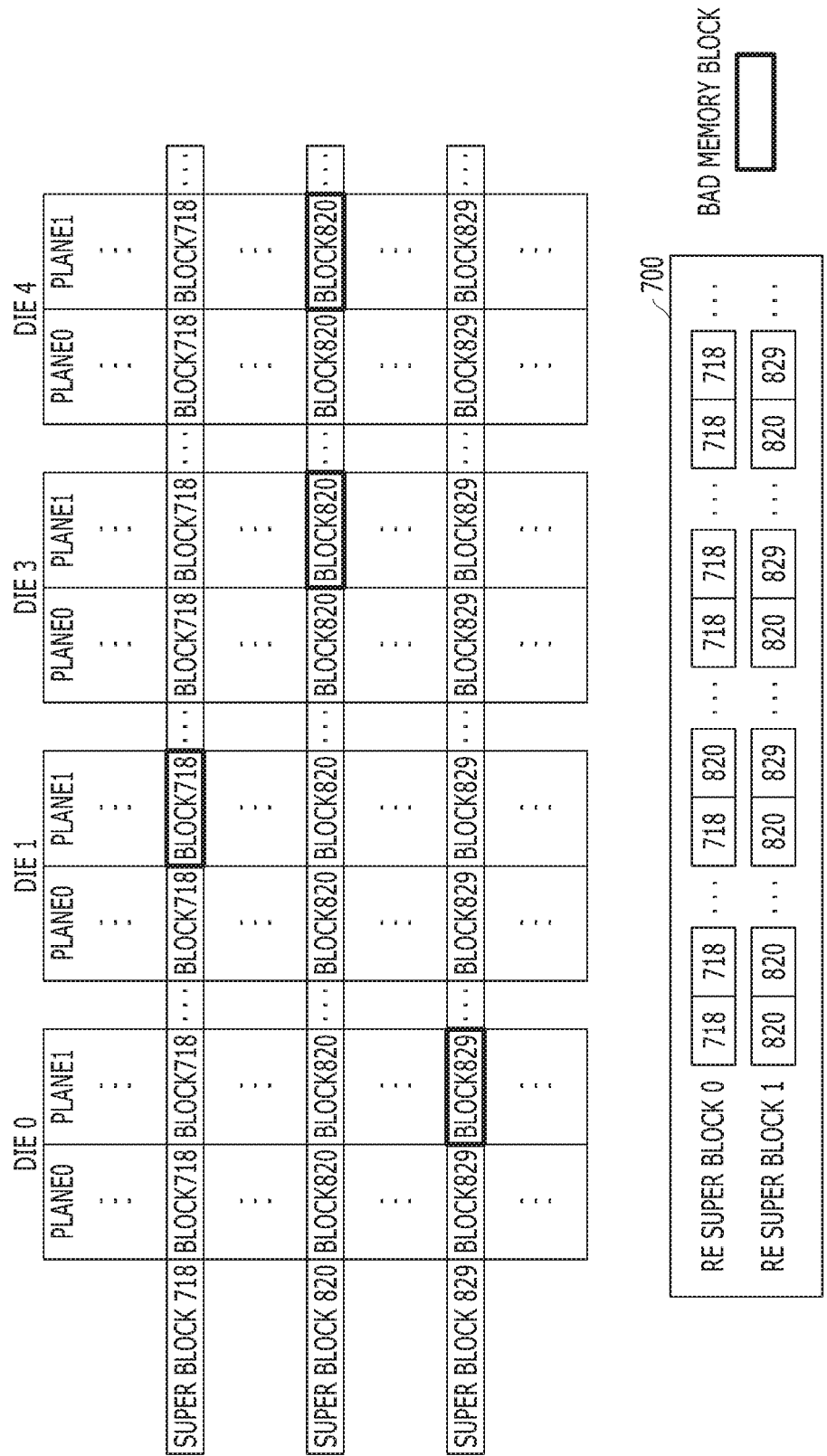

FIGS. 6A and 6B are diagrams to assist in the explanation of an operation of managing memory blocks by the unit of super memory block in the memory system in accordance with an embodiment of the present invention.

First, referring to FIG. 6A, a scheme of forming super memory blocks for managing the plurality of memory blocks in the memory device 150 by dividing them into the super memory blocks, using the controller 130, in accordance with an embodiment is illustrated.

In the embodiment of FIG. 6A, the memory device 150 includes eight memory dies DIE<0:7>, each of the eight memory dies DIE<0:7> includes four planes PLANE<0:3> to allow the eight memory dies DIE<0:7> to include total 32 planes PLANE<0:3>*8, and each of the 32 planes PLANE<0:3>*8 includes 1024 memory blocks BLOCK<0:1023>. In other words, the memory device 150 includes total 32768 memory blocks BLOCK<0:1023>*32.

Also, in the memory device 150 illustrated in FIG. 6A, the total 32 planes PLANE<0:3>*8 in the eight memory dies DIE<0:7> input/output data through two channels CH<0:1> and eight ways WAY<0:7>. Namely, four ways WAY<0:3>/WAY<4:7> share one channel CH0/CH1 and four planes PLANE<0:3> share one way WAY0/WAY1/WAY2/WAY3/WAY4/WAY5/WAY6/WAY7.

The controller 130 of the memory system 110 in accordance with the present embodiment uses a scheme of managing the plurality of memory blocks in the memory device 150 in the unit of a super memory block. In particular, it may be seen that the embodiment shown in FIG. 6A uses the third scheme of dividing memory blocks into super memory blocks by the controller 130 as described above with reference to FIG. 5.

That is to say, in FIG. 6A, the controller 130 forms each of the super memory blocks SUPER BLOCK<0:1023> by selecting one memory block in each of 32 planes PLANE<0:3>*8 in the memory device 150, and manages the super blocks. Therefore, 32 memory blocks are included in each of the super memory blocks SUPER BLOCK<0:1023>.

Since the controller 130 selects simultaneously the 32 memory blocks in each of the super memory blocks SUPER BLOCK<0:1023>, in a configuration in which management is performed by the unit of super memory block as in FIG. 6A, super memory block addresses (not shown) for selecting the respective super memory blocks SUPER BLOCK<0:1023> may be used.

In this manner, in order to use the super memory block addresses, the controller 130 uses a scheme of managing super memory blocks by grouping memory blocks of the same relative positions in the respective 32 planes PLANE<0:3>*8 in the memory device 150.

For example, the controller 130 forms and manages a zeroth super memory block SUPER BLOCK0 by grouping 32 zeroth memory blocks BLOCK0 in the respective 32 planes PLANE<0:3>*8, forms and manages a first super memory block SUPER BLOCK1 by grouping 32 first memory blocks BLOCK1 in the respective 32 planes PLANE<0:3>*8, and forms and manages a second super memory block SUPER BLOCK2 by grouping 32 second memory blocks BLOCK2 in the respective 32 planes PLANE<0:3>*8. In this manner, the controller 130 manages the 32768 memory blocks BLOCK<0:1023>*32 in the memory device 150 by managing 1024 super memory blocks SUPER BLOCK<0:1023>, each containing 32 memory blocks.

The fact that the controller 130 manages the memory blocks BLOCK<0:1023>*32 by managing the super blocks SUPER BLOCK<0:1023>, means that the controller 130 sets an access processing unit to super memory block unit. That said, even though the controller 130 selects each of the super memory blocks SUPER BLOCK<0:1023> by using its super memory block address, that does not mean that each individual memory block address is not used; rather, each memory block address is repeatedly used in the controller 130. For example, the fact that the controller 130 accesses the zeroth super memory block SUPER BLOCK0 through a zeroth super memory block address means that 32 memory blocks corresponding to 32 zeroth memory blocks BLOCK0 of the respective 32 planes PLANE<0:4>*8 which are grouped into the zeroth super memory block SUPER BLOCK0 are accessed at once.

Also, it is nearly impossible for all the memory blocks in the memory device 150 to operate normally. Namely, when mounting and using the memory device 150, there is usually at least one bad memory block which does not operate among the plurality of memory blocks. Such a memory block, which has poor durability, may be determined as a bad memory block because it does not perform a normal operation even when the lifetime limit is not reached.

In this regard, as described above, in the case where, in order to use super memory block addresses (not shown), the controller 130 uses the scheme of managing super memory blocks by grouping memory blocks of the same relative positions or locations in the respective 32 planes PLANE<0:3>*8, it is not possible to set an access processing unit to a super memory block unit for a super memory block, among the super memory blocks SUPER BLOCK<0:1023>, in which a bad memory block is included.

That is, even though only one memory block is a bad memory block and all the remaining 31 memory blocks are good, if the access processing unit of the corresponding super memory block cannot be set to super memory block unit, it is markedly inefficient to manage such a super block.

In consideration of this fact, a super memory block where at least one memory block included therein is a bad memory block is reused by employing a regenerated super block table 700 as shown in FIG. 6B.

Referring to FIG. 6B, it may be seen that one or more memory blocks among the 32 memory blocks in each of the 718th super memory block SUPER BLOCK718, the 820th super memory block SUPER BLOCK820 and the 829th super memory block SUPER BLOCK829, among all of super memory blocks SUPER in the memory device 150, are determined as bad memory blocks.

In detail, among the 32 memory blocks included in the 718^th super memory block SUPER BLOCK718, the memory block in the first plane PLANE1 of the first memory die DIE1 is determined as a bad memory block and the remaining 31 memory blocks are good memory blocks.

Also, among the 32 memory blocks included in the 820th super memory block SUPER BLOCK820, the memory block in the first plane PLANE1 of the third memory die DIE3 and the memory block in the first plane PLANE1 of the fourth memory die DIE4 are determined as bad memory blocks and the remaining 30 memory blocks are good memory blocks.

Moreover, among the 32 memory blocks included in the 829th super memory block SUPER BLOCK829, the memory block in the first plane PLANE1 of the zeroth memory die DIE0 is determined as a bad memory block and the remaining 31 memory blocks are good memory blocks.

In this state, the controller 130 generates the regenerated super block table 700 for replacing the bad memory blocks in the respective 718th super memory block SUPER BLOCK718, 820th super memory block SUPER BLOCK820 and 829th super memory block SUPER BLOCK829, determined as bad super memory blocks, with good memory blocks, thereby regenerating normally operating super memory blocks.

In detail, in order to reuse the 718th super memory block SUPER BLOCK718, the controller 130 should search for a memory block capable of replacing the bad memory block in the first plane PLANE1 of the first memory die DIE1.

To this end, the controller 130 searches for a super memory block in which at least one bad memory block is included, among the super memory blocks SUPER BLOCK<0:1023>. Of course, the controller 130 excludes from the search target any super memory block having only good memory blocks.

The controller 130 may search the 820th super memory block SUPER BLOCK820 which includes two bad memory blocks. In doing so, the controller 130 checks whether the position or location of either of the bad memory blocks in the 820th super memory block SUPER BLOCK820 is the same as that of the bad memory block in the 718th super memory block SUPER BLOCK718.

If a bad block in the same location exists, the 820th super memory block SUPER BLOCK820 is excluded as a search target, and another super memory block is searched. Conversely, if there is no bad block in the same position, the 820th super memory block SUPER BLOCK820 is determined as a search target super memory block.

As can be seen from the drawing, the bad memory block of the 718th super memory block SUPER BLOCK718 is located in the first plane PLANE1 of the first memory die DIE1, and the bad memory blocks of the 820th super memory block SUPER BLOCK820 are located in the first plane PLANE1 of the third memory die DIE3 and the first plane PLANE1 of the fourth memory die DIE4. In other words, the locations of the bad memory blocks in the 820th super memory block SUPER BLOCK820 do not overlap with the location of the bad memory block in the 718th super memory block SUPER BLOCK718.

Therefore, the controller 130 determines the 820th super memory block SUPER BLOCK820 as a search target, and generates the regenerated super block table 700 such that the memory block in the first plane PLANE1 of the first memory die DIE1, among the 32 memory blocks in the 820th super memory block SUPER BLOCK820, may be used in the 718th super memory block SUPER BLOCK718.

Namely, in order to replace the 718th super memory block SUPER BLOCK718, the controller 130 sets the first row of the regenerated super block table 700 as a zeroth regenerated super memory block RE SUPER BLOCK0, and stores the block address values of 32 memory blocks for replacing the 718th super memory block SUPER BLOCK718.

Thus, in the values of the zeroth regenerated super memory block RE SUPER BLOCK0 stored in the first row of the regenerated super block table 700, only one block address for indicating the memory block in the first plane PLANE1 of the first memory die DIE1 is the block address of the 820th super memory block SUPER BLOCK820, and all the remaining 31 block addresses are the block addresses of the 718th super memory block SUPER BLOCK718.

In this way, because the regenerated super block table 700 is generated, when the controller 130 accesses the 718th super memory block SUPER BLOCK718, reference may be made to the values of the zeroth regenerated super memory block RE SUPER BLOCK0 stored in the first row of the regenerated super block table 700.

Then, in order to reuse the 820th super memory block SUPER BLOCK820, the controller 130 should search for memory blocks capable of replacing the memory block in the first plane PLANE1 of the first memory die DIE1, the bad memory block in the first plane PLANE1 of the third memory die DIE3 and the bad memory block in the first plane PLANE1 of the fourth memory die DIE4 among the 32 memory blocks included in the 820th super memory block SUPER BLOCK820.

The reason why a search is conducted for memory blocks capable of replacing three memory blocks among the 32 memory blocks included in the 820th super memory block SUPER BLOCK820, even though there are only two bad memory blocks among the 32 memory blocks in the 820th super memory block SUPER BLOCK820, is that one memory block of the 820th super memory block SUPER BLOCK820 is used to normally operate the 718th super memory block SUPER BLOCK718 as a regenerated super memory block. Namely, the reason is that the regenerated super block table 700 is generated to use the memory block in the first plane PLANE1 of the first memory die DIE1 among the 32 memory blocks included in the 820th super memory block SUPER BLOCK820.

Hence, in order to reuse the 820th super memory block SUPER BLOCK820, the controller 130 searches for a super memory block in which at least one bad memory block is included, among the super memory blocks SUPER BLOCK<0:1023>. Of course, the controller 130 excludes as a search target any super memory block, among the super memory blocks SUPER BLOCK<0:1023>, in which only good memory blocks are included.

The controller 130 may search the 829th super memory block SUPER BLOCK829 which includes one bad memory block. In doing so, the controller 130 checks whether the location of the bad memory block in the 829th super memory block SUPER BLOCK829 is the same as the location of the bad memory block in the 718th super memory block SUPER BLOCK718 and the locations of the bad memory blocks included in the 820th super memory block SUPER BLOCK820.

If blocks in the same location exists, the 829th super memory block SUPER BLOCK829 is excluded as a search target, and another super memory block is searched. Conversely, if there is no location overlap, the 829th super memory block SUPER BLOCK829 is determined as a search target super memory block.

As can be seen from FIG. 6B, the bad memory block of the 829th super memory block SUPER BLOCK829 is located in the first plane PLANE1 of the zeroth memory die DIE0, the bad memory block of the 718th super memory block SUPER BLOCK718 is located in the first plane PLANE1 of the first memory die DIE1, and the bad memory blocks of the 820th super memory block SUPER BLOCK820 are located in the first plane PLANE1 of the third memory die DIE3 and the first plane PLANE1 of the fourth memory die DIE4. That is to say, the location of the bad memory block of the 829th super memory block SUPER BLOCK829 does not overlap with the locations of the bad memory blocks in the 820th super memory block SUPER BLOCK820 and the location of the bad memory block included in the 718th super memory block SUPER BLOCK718.

Therefore, the controller 130 determines the 829th super memory block SUPER BLOCK829 as a search target, and generates the regenerated super block table 700 such that the memory block in the first plane PLANE1 of the first memory die DIE1, the memory block in the first plane PLANE1 of the third memory DIE3 and the memory block in the first plane PLANE1 of the fourth memory die DIE4 of the 829th super memory block SUPER BLOCK829 may be used in the 820th super memory block SUPER BLOCK820.

Namely, in order to replace the 820th super memory block SUPER BLOCK820, the controller 130 sets the second row of the regenerated super block table 700 as a first regenerated super memory block RE SUPER BLOCK1, and stores the respective block address values of 32 memory blocks for replacing the 820th super memory block SUPER BLOCK820.

Thus, among the values of the first regenerated super memory block RE SUPER BLOCK1 stored in the second row of the regenerated super block table 700, only three are block addresses for blocks in the super memory block SUPER BLOCK829: one indicating the memory block in the first plane PLANE1 of the first memory die DIE1, another indicating the memory block in the first plane PLANE1 of the third memory die DIE3 and the third indicating the memory block in the first plane PLANE1 of the fourth memory die DIE4. All the remaining 29 block addresses are for memory blocks of the 820th super memory block SUPER BLOCK820.

In this way, because the regenerated super block table 700 is generated, when the controller 130 accesses the 820th super memory block SUPER BLOCK820, reference may be made to the values of the first regenerated super memory block RE SUPER BLOCK1 stored in the second row of the regenerated super block table 700.

Then, in order to reuse the 829th super memory block SUPER BLOCK829, the controller 130 should search for memory blocks capable of replacing the bad memory block in the first plane PLANE1 of the zeroth memory die DIE0, the memory block in the first plane PLANE1 of the first memory die DIE1, the memory block in the first plane PLANE1 of the third memory die DIE3 and the memory block in the first plane PLANE1 of the fourth memory die DIE4, among the 32 memory blocks included in the 829th super memory block SUPER BLOCK829.

The reason why memory blocks capable of replacing four memory blocks among the 32 memory blocks in the 829th super memory block SUPER BLOCK829 are searched for, even though only one bad memory block is in the 829th super memory block SUPER BLOCK829, is that three good memory blocks of the 829th super memory block SUPER BLOCK829 are used to normally operate the 820th super memory block SUPER BLOCK820 as a regenerated super memory block. Namely, the reason is that the regenerated super block table 700 is generated to use the memory blocks in the first plane PLANE1 of the first memory die DIE1, the first plane PLANE1 of the third memory die DIE3 and the first plane PLANE1 of the fourth memory die DIE4 among the 32 memory blocks included in the 829th super memory block SUPER BLOCK829.

Hence, in order to reuse the 829th super memory block SUPER BLOCK829, the controller 130 searches for a super memory block in which at least one bad memory block is included, among the super memory blocks SUPER BLOCK<0:1023>. Of course, the controller 130 excludes as a search target any super memory block among the super memory blocks SUPER BLOCK<0:1023>, in which only good memory blocks are included.

As a result of the search, the controller 130 may not search a super memory block which includes a bad memory block. Accordingly, the controller 130 does not reuse the 829th super memory block SUPER BLOCK829.

By using the regenerated super block table 700 as described above with reference to FIG. 6B, even though bad memory blocks are included in the three super memory blocks SUPER BLOCK718, SUPER BLOCK820 and SUPER BLOCK829, it is possible to set an access processing unit to super memory block unit for the two super memory blocks SUPER BLOCK718 and SUPER BLOCK820.

That is to say, in the scheme as shown in FIG. 6B, some super memory blocks, i.e., SUPER BLOCK718 and SUPER BLOCK820, among the super memory blocks SUPER BLOCK718, SUPER BLOCK820 and SUPER BLOCK829 including bad memory blocks, are normally used, and only the super memory block SUPER BLOCK829 is not used.

However, even in the scheme as shown in FIG. 6B, the super memory block SUPER BLOCK829, although incapable of being used, still exists, and the good memory blocks in the super memory block SUPER BLOCK829 cannot be used because they are not grouped by a super memory block unit.

Therefore, the memory system 110, in accordance with an embodiment, may operate in such a way as to allow a super memory block, which includes a bad memory block as will be described below with reference to FIGS. 7 to 9, to utilize all good memory blocks. That is, a situation in which a good memory block that is incapable of being used does not exist.

Figure 7:
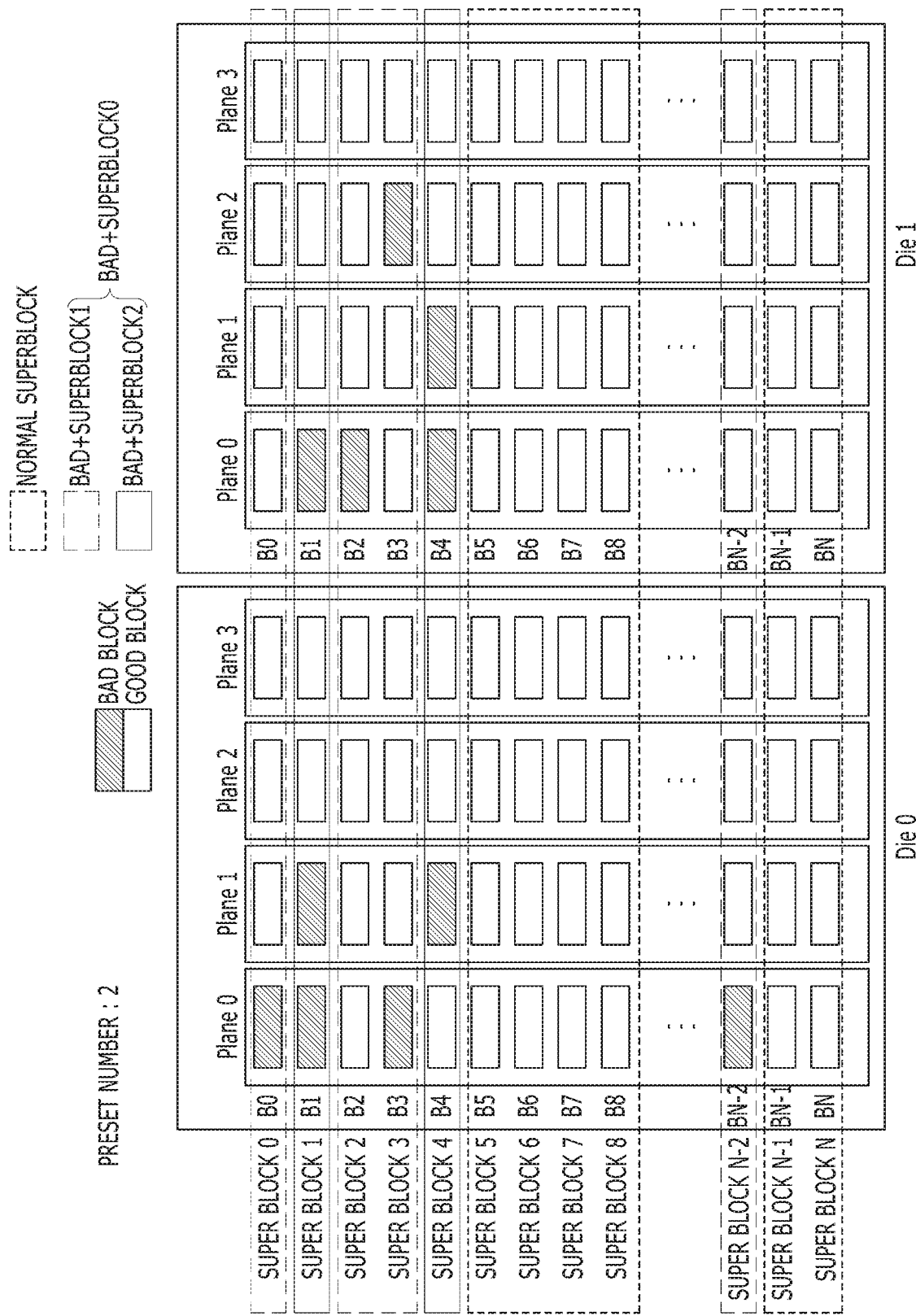
FIGS. 7 to 9 are diagrams to assist in the explanation of an operation of managing a super memory block including a bad memory block in the memory system in accordance with an embodiment of the present invention.
Figure 8:
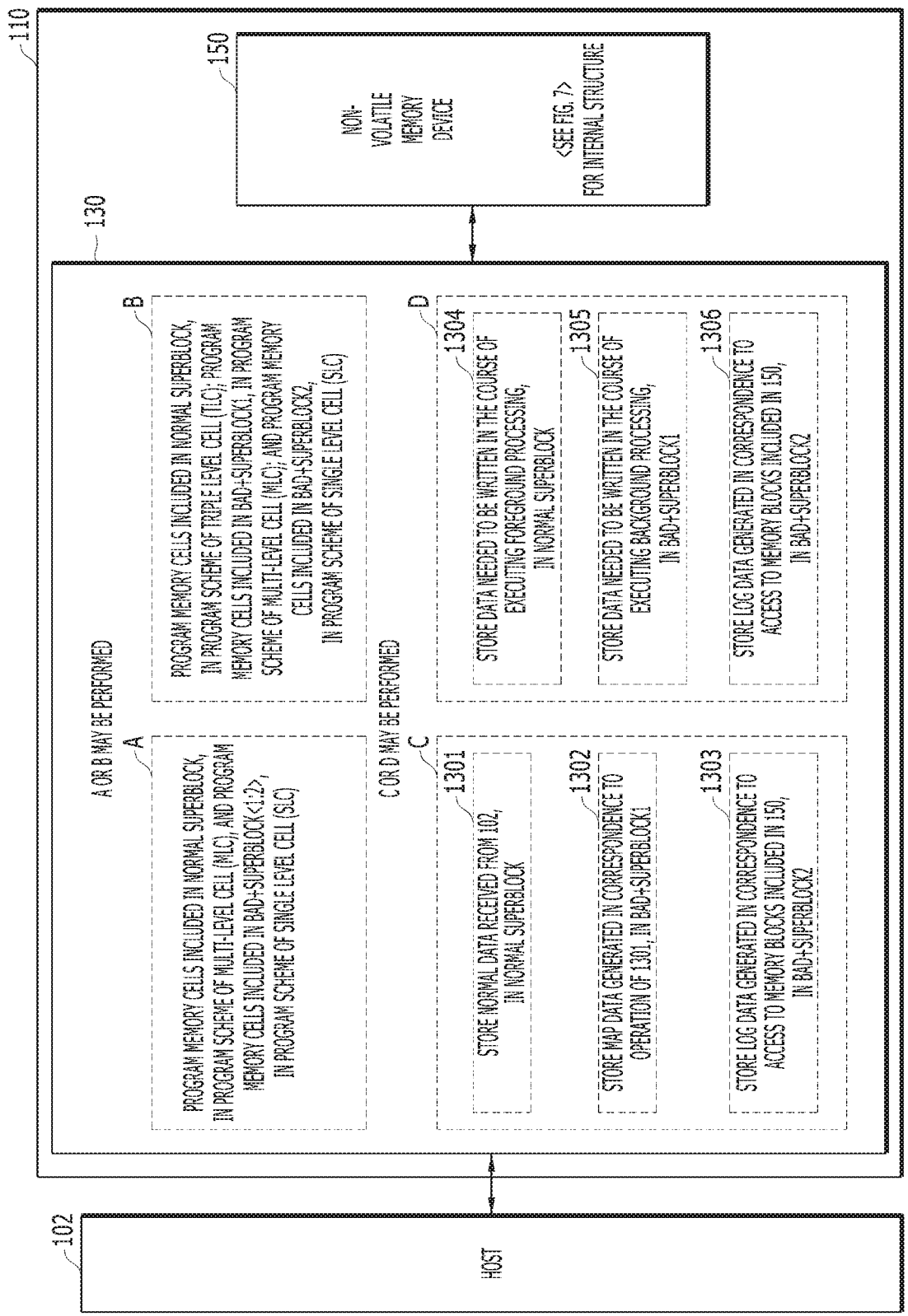
Figure 9:
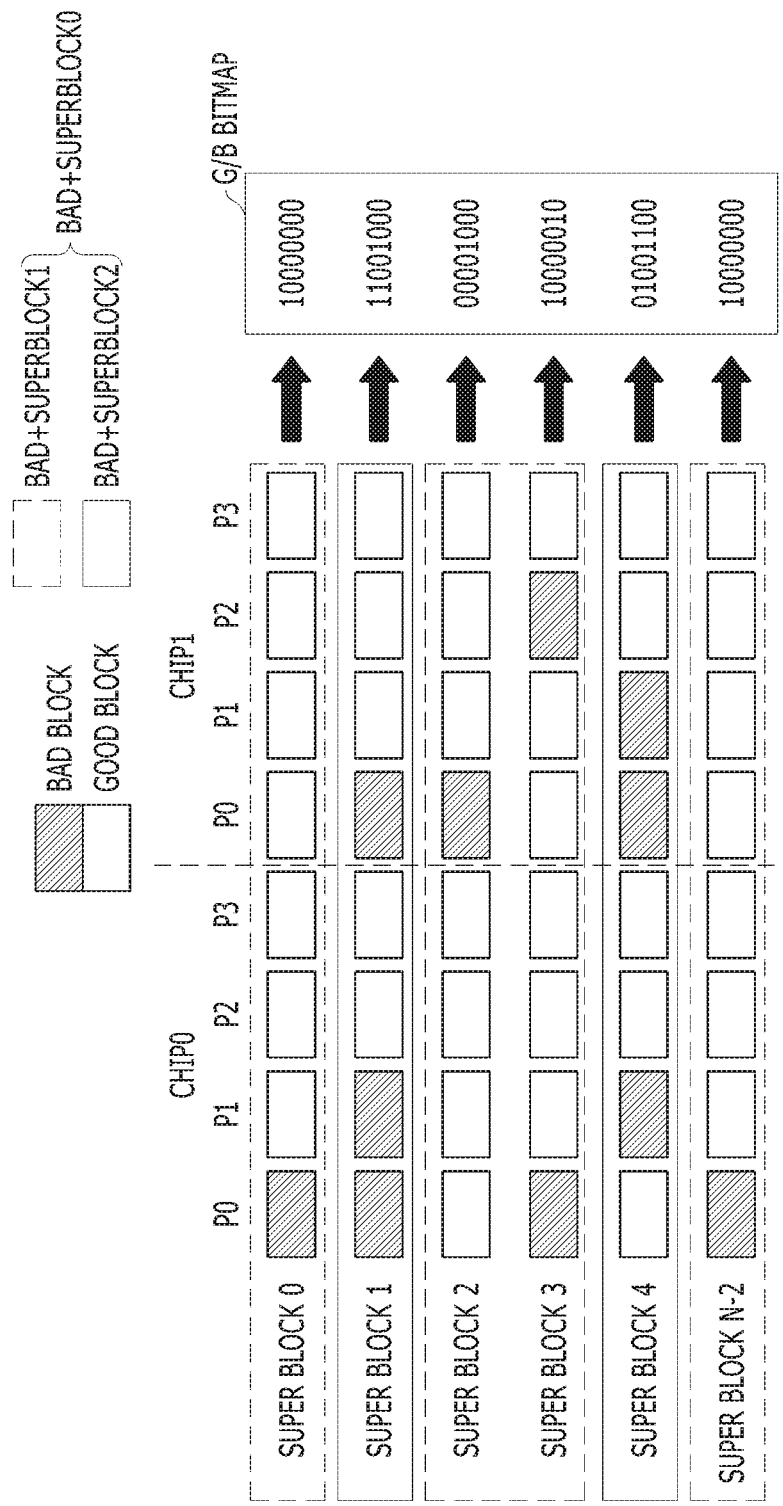

FIGS. 7 to 9 are diagrams to assist in the explanation of an operation of managing a super memory block including a bad memory block in the memory system in accordance with an embodiment.

First, referring to FIG. 7, it may be seen that, the controller 130 manages super memory blocks by mixing bad memory blocks and good memory blocks.

First, the memory device 150 shown in FIG. 7 includes two memory dies DIE<0:1>, each of the two memory dies DIE<0:1> includes four planes PLANE<0:3> to allow the two memory dies DIE<0:1> to include total eight planes PLANE<0:3>*2, and each of the eight planes PLANE<0:3>*2 includes (N+1) memory blocks B<0:N>. This configuration is an example only.

The controller 130 of the memory system 110 uses a scheme of managing the plurality of memory blocks by dividing them among super blocks and managing them by the unit of super memory block. In particular, FIG. 7 uses the third scheme of dividing memory blocks into super memory blocks by the controller 130 as described above with reference to FIG. 5.

That is to say, in FIG. 7, the controller 130 manages each of super memory blocks SUPER BLOCK<0:N> by selecting one memory block in each of the eight planes PLANE<0:3>*2 in the memory device 150. Therefore, eight memory blocks are included in each of the super memory blocks SUPER BLOCK<0:N>.

Further, in the embodiment shown in FIG. 7, some super blocks include at least one bad block with the remainder being good blocks. That is, a super memory block may include one or more bad memory blocks.

For example, in FIG. 7, in the case of a zeroth super memory block SUPER BLOCK<0>, one memory block corresponding to a zeroth plane PLANE<0> of a zeroth die DIE<0> is a bad memory block, and that one bad memory block is grouped with seven good memory blocks.

In FIG. 7, in the case of a first super memory block SUPER BLOCK<1>, three memory blocks corresponding to the zeroth plane PLANE<0> of the zeroth die DIE<0>, a first plane PLANE<1> of the zeroth die DIE<0> and a zeroth plane PLANE<0> of a first die DIE<1> are bad memory blocks, and they are grouped with five good memory blocks.

In FIG. 7, in the case of a second super memory block SUPER BLOCK<2>, one memory block corresponding to the zeroth plane PLANE<0> of the first die DIE<1> is a bad memory block, and it is grouped with seven good memory blocks.

In FIG. 7, in the case of a third super memory block SUPER BLOCK<3>, two memory blocks corresponding to the zeroth plane PLANE<0> of the zeroth die DIE<0> and a second plane PLANE<2> of the first die DIE<1> are bad memory blocks, and they are grouped with six good memory blocks.

In FIG. 7, in the case of a fourth super memory block SUPER BLOCK<4>, three memory blocks corresponding to the first plane PLANE<1> of the zeroth die DIE<0>, the zeroth plane PLANE<0> of the first die DIE<1> and the first plane PLANE<1> of the first die DIE<1> are bad memory blocks, and they are grouped with five good memory blocks.

In FIG. 7, in the case of an (N-2)th super memory block SUPER BLOCK<N-2>, one memory block corresponding to the zeroth plane PLANE<0> of the zeroth die DIE<0> is a bad memory block, and it is grouped with seven good memory blocks.

Each of the remaining super memory blocks SUPER BLOCK<5:N-3, N-1, N> includes no bad memory block, and thus they are managed as normal super memory blocks, each with eight good memory blocks only.

As described above, in FIG. 7, in the case of the super memory blocks SUPER BLOCK<0:4, N-2> in each of which at least one bad memory block and good memory blocks are grouped, it is impossible to set an access processing unit to super memory block unit as described above with reference to FIGS. 6A and 6B.

For example, in FIG. 7, in the case of the zeroth super memory block SUPER BLOCK<0>, the second super memory block SUPER BLOCK<2> and the (N-2)th super memory block SUPER BLOCK<N-2>, only seven good memory blocks are included in each of them. In the case of the third super memory block SUPER BLOCK<3>, only six good memory blocks are included. In the case of the first super memory block SUPER BLOCK<1> and the fourth super memory block SUPER BLOCK<4>, only five good memory blocks are included in each of them.

Thus, each of the normal super memory blocks SUPER BLOCK<5:N-3, N-1, N>, in which no bad memory block is included, satisfy the condition of the access processing unit being the super memory block unit because the eight memory blocks are accessed at once. Conversely, in the case of the super memory blocks SUPER BLOCK<0:4, N-2>, each including at least one bad memory block, they do not satisfy the condition of the access processing unit being the super memory block unit.

In consideration of this, the controller 130 manages the super memory blocks SUPER BLOCK<0:4, N-2> by classifying them as first super blocks BAD+SUPERBLOCK0. Conversely, the normal super memory blocks SUPER BLOCK<5:N-3, N-1, N>, in which no bad memory block is included, only eight good memory blocks in each such super block, are managed by being classified as second super blocks NORMAL SUPERBLOCK.

Also, the controller 130 differently manages the respective uses of the first super blocks BAD+SUPERBLOCK0 based on the numbers of the bad memory blocks included in the respective first super blocks BAD+SUPERBLOCK0. That is to say, the controller 130 manages first super blocks SUPER BLOCK<0, 2, 3, N-2>, each of which includes a number of bad memory blocks which is equal to or less than a preset number, among the first super blocks BAD+SUPERBLOCK0, by classifying them as third super blocks BAD+SUPERBLOCK1. Also, the controller 130 manages first super blocks SUPER BLOCK<1,4>, each of which includes a number of bad memory blocks that exceeds the preset number, among the first super blocks BAD+SUPERBLOCK0, by classifying them as fourth super blocks BAD+SUPERBLOCK2.

For example, the preset number may be '2' as shown in FIG. 7. In other words, the controller 130 manages the first super blocks SUPER BLOCK<0, 2, 3, N-2>, each of which includes 2 or less bad memory blocks, among the first super blocks BAD+SUPERBLOCK0, by classifying them as the third super blocks BAD+SUPERBLOCK1. Accordingly, in the third super blocks BAD+SUPERBLOCK1, there are included the zeroth super memory block SUPER BLOCK<0>, the second super memory block SUPER BLOCK<2>, the third super memory block SUPER BLOCK<3> and the (N-2)th super memory block SUPER BLOCK<N-2>.

Further, the controller 130 manages the first super blocks SUPER BLOCK<1,4>, each of which includes more than 2 bad memory blocks, among the first super blocks BAD+SUPERBLOCK0, by classifying them as the fourth super blocks BAD+SUPERBLOCK2. Accordingly, in the fourth super blocks BAD+SUPERBLOCK2, there are included the first super memory block SUPER BLOCK<1> and the fourth super memory block SUPER BLOCK<4>.

The preset number is not limited to '2'; rather, the preset number may be set to a different value depending on design and operational considerations. Moreover, in classifying the super blocks into different types, the classified types may be more than two. For example, the controller 130 may classify first super blocks into four super blocks based two preset numbers.

While not concretely illustrated in FIG. 7, there may occur a case where a certain super block which has been managed by being classified as a second super block NORMAL SUPERBLOCK in an initial operation of the memory system 110 is managed by being classified as the first super block BAD+SUPERBLOCK0 as erase-write cycles are repeatedly performed.

That is to say, there may occur a case where a good memory block of a certain super block which has been managed by being classified as a second super blocks NORMAL SUPERBLOCK in an initial operation of the memory system 110 may be determined as a bad memory block due to repetition of erase-write cycles. In this case, the controller 130 moves the valid data stored in the certain super block in which a bad has occurred, to a target super block through a merge operation, and then, manages the certain super block which enter a free state, as a first super block BAD+SUPERBLOCK0. In this regard, depending on whether the number of the bad memory blocks in the certain super block which enter a free state exceeds the preset number or not, it is determined whether to manage the certain super block as a third super block BAD+SUPERBLOCK1 or a fourth super block BAD+SUPERBLOCK2.

In this regard, in order to prevent the reliability of the valid data having been stored in the certain super block, in which a bad block has become present, from degrading, the controller 130 may additionally perform an operation of detecting and correcting an error of the valid data having been stored in the certain super block, and may then move only the valid data determined as being normal, to a target super block through a merge operation.

Referring to FIG. 8, in the controller 130 of the memory system 110 in accordance with an embodiment described above with reference to FIG. 7, the uses and management methods of the first super blocks BAD+SUPERBLOCK0 which are divided into the third super blocks BAD+SUPERBLOCK1 and the fourth super blocks BAD+SUPERBLOCK2 and the second super blocks NORMAL SUPERBLOCK are illustrated.

In detail, a method of using the first super blocks BAD+SUPERBLOCK0 which are divided into the third super blocks BAD+SUPERBLCOK1 and the fourth super blocks BAD+SUPERBLCOK2 and the second super blocks NORMAL SUPERBLOCK may be described according to the following two use methods C and D.

The first use method C is as follows.

First, the controller 130 stores normal data, corresponding to a write command received from the host 102, in the second super blocks NORMAL SUPERBLOCK at step 1301.

The controller 130 stores the map data generated in correspondence to the step 1301 of storing the normal data in the second super blocks NORMAL SUPERBLOCK, in the third super blocks BAD+SUPERBLOCK1 at step 1302.

The controller 130 stores the log data, generated in correspondence to accesses to the memory blocks PLANE<0:3>*2*{N+1} in the memory device 150, in the fourth super blocks BAD+SUPERBLCOK2 at step 1303.

The second use method D is as follows.

First, the controller 130 stores data necessary to be written in the course of executing a foreground processing in the second super blocks NORMAL SUPERBLOCK at step 1304.

The controller 130 stores data necessary to be written in the course of executing a background processing in the third super blocks BAD+SUPERBLOCK1 at step 1305.

The controller 130 stores the log data, generated in correspondence to accesses to the memory blocks PLANE<0:3>*2*{N+1} in the memory device 150, in the fourth super blocks BAD+SUPERBLCOK2 at step 1306.

Thus, the controller 130 selects which data to be stored in the first super blocks BAD+SUPERBLOCK0, which are divided into the third super blocks BAD+SUPERBLOCK1 and the fourth super blocks BAD+SUPERBLOCK2, and the second super blocks NORMAL SUPERBLOCK, by applying the above-described first use method C or second use method D.

That is to say, the controller 130 differently stores data in the first super blocks BAD+SUPERBLOCK0 and the second super blocks NORMAL SUPERBLOCK, according to the attributes of the data.

Through this, the controller 130 may differentiate the attribute of data stored in the second super blocks NORMAL SUPERBLOCK, in which no bad memory block is included, and the attribute of data stored in the first super blocks BAD+SUPERBLOCK0, in each of which at least one bad memory block is included.

Moreover, the controller 130 may differentiate the attribute of data to be stored in the case where a relatively small number of bad memory blocks are included as in each of the third super blocks BAD+SUPERBLOCK1 and the attribute of data to be stored in the case where a relatively large number of bad memory blocks are included as in each of the fourth super blocks BAD+SUPERBLOCK2.

The controller 130 may manage the memory cells included in the first super blocks BAD+SUPERBLOCK0, which are divided into the third super blocks BAD+SUPERBLOCK1 and the fourth super blocks BAD+SUPERBLOCK2, and the second super blocks NORMAL SUPERBLOCK, by the following two program methods A and B.

The first program method A is as follows.

First, the controller 130 programs the memory cells included in the second super blocks NORMAL SUPERBLOCK, in the program scheme for a multi-level cell (MLC). Such a scheme involves programming 2 or more-bit data in one cell.

The controller 130 programs the memory cells in the first super blocks BAD+SUPERBLOCK0, which are divided into the third super blocks BAD+SUPERBLCOK1 and the fourth super blocks BAD+SUPERBLCOK2, in the program scheme of a single level cell (SLC).

The second program method B is as follows.

First, the controller 130 programs the memory cells in the second super blocks NORMAL SUPERBLOCK, in the program scheme of a triple level cell (TLC).

The controller 130 programs the memory cells in the third super blocks BAD+SUPERBLOCK1 in the program scheme of a multi-level cell (MLC). This involves programming 2-bit data in one cell.

The controller 130 programs the memory cells in the fourth super blocks BAD+SUPERBLOCK2 in the program scheme of a single level cell (SLC).

Thus, the controller 130 selects which program scheme to manage the memory cells in the first super blocks BAD+SUPERBLOCK0 and the second super blocks NORMAL SUPERBLOCK by applying the above-described first program method A or second program method B.

Through this, the controller 130 may differentiate a program scheme for the memory cells in the second super blocks NORMAL SUPERBLOCK, in which no bad memory block is included, and a program scheme for the memory cells in the first super blocks BAD+SUPERBLOCK0, in each of which at least one bad memory block is included.

Moreover, the controller 130 may differentiate a program scheme for the memory cells in the third super blocks BAD+SUPERBLOCK1, each of which includes a relatively small number of bad memory blocks, and a program scheme for the memory cells in the fourth super blocks BAD+SUPERBLOCK2, each of which includes a relatively large number of bad memory blocks.

Referring to FIG. 9, it illustrates a scheme in which the controller 130 of the memory system 110, in accordance with an embodiment of the present disclosure, manages the first super blocks BAD+SUPERBLOCK0, which are divided into the third super blocks BAD+SUPERBLOCK1 and the fourth super blocks BAD+SUPERBLOCK2.

In detail, referring to FIGS. 7 and 9 together, the controller 130 manages the good/bad states of the memory blocks grouped into the first super blocks BAD+SUPERBLOCK0, which are divided into the third super blocks BAD+SUPERBLOCK1 and the fourth super blocks BAD+SUPERBLOCK2, by a state bitmap G/B BITMAP.

That is to say, in the case of the zeroth super memory block SUPER BLOCK<0>, among the third super blocks BAD+SUPERBLOCK1, one memory block corresponding to the zeroth plane PLANE<0> of the zeroth die DIE<0> is a bad memory block, and the remainder are good memory blocks. Thus, the value of the state bitmap G/B BITMAP corresponding to the zeroth super memory block SUPER BLOCK<0> is '10000000.'

In the case of the second super memory block SUPER BLOCK<2>, among the third super blocks BAD+SUPERBLOCK1, one memory block corresponding to the zeroth plane PLANE<0> of the first die DIE<1> is a bad memory block, and the remainder are good memory blocks. Thus, the value of the state bitmap G/B BITMAP corresponding to the second super memory block SUPER BLOCK<2> is '00001000.'

In the case of the third super memory block SUPER BLOCK<3>, among the third super blocks BAD+SUPERBLOCK1, two memory blocks corresponding to the zeroth plane PLANE<0> of the zeroth die DIE<0> and the second plane PLANE<2> of the first die DIE<1> are bad memory blocks, and the remainder are good memory blocks. Thus, the value of the state bitmap G/B BITMAP corresponding to the third super memory block SUPER BLOCK<3> is '10000010.'

In the case of the (N−2)th super memory block SUPER BLOCK<N−2>, among the third super blocks BAD+SUPERBLOCK1, one memory block corresponding to the zeroth plane PLANE<0> of the zeroth die DIE<0> is a bad memory block, and the remainder are good memory blocks. Thus, the value of the state bitmap G/B BITMAP corresponding to the (N−2)th super memory block SUPER BLOCK<N−2> is '10000000.'

In the case of the first super memory block SUPER BLOCK<1>, among the fourth super blocks BAD+SUPERBLOCK2, three memory blocks corresponding to the zeroth plane PLANE<0> of the zeroth die DIE<0>, the first plane PLANE<1> of the zeroth die DIE<0> and the zeroth plane PLANE<0> of the first die DIE<1> are bad memory blocks, and the remainder are good memory blocks. Thus, the value of the state bitmap G/B BITMAP corresponding to the first super memory block SUPER BLOCK<1> is '11001000.'

In the case of the fourth super memory block SUPER BLOCK<4>, among the fourth super blocks BAD+SUPERBLOCK2, three memory blocks corresponding to the first plane PLANE<1> of the zeroth die DIE<0>, the zeroth plane PLANE<0> of the first die DIE<1> and the first plane PLANE<1> of the first die DIE<1> are bad memory blocks, and the remainder are good memory blocks. Thus, the value of the state bitmap G/B BITMAP corresponding to the fourth super memory block SUPER BLOCK<4> is '01001100.'

As described above, the controller 130 manages the good/bad states of the memory blocks grouped into the first super blocks BAD+SUPERBLOCK0, which are divided into the third super blocks BAD+SUPERBLOCK1 and the fourth super blocks BAD+SUPERBLOCK2, by the state bitmap G/B BITMAP. Through this, when using the first super blocks BAD+SUPERBLOCK0 according to the use method C or D described above with reference to FIG. 8, the controller 130 may quickly and accurately find good memory blocks.

For example, when the controller 130 stores the map data generated in correspondence to the storage of the normal data in the second super blocks NORMAL SUPERBLOCK, in the third super blocks BAD+SUPERBLCOK1 at step 1302, the map data should be stored in only the good memory blocks of the third super blocks BAD+SUPERBLCOK1.

Therefore, the controller 130 quickly and accurately checks where good memory blocks are located, through the state bitmap G/B BITMAP of the third super blocks BAD+SUPERBLCOK1 for storing the map data.

In this way, the controller 130 stores the map data in only the good memory blocks of the third super blocks BAD+SUPERBLOCK1 as a result of checking the state bitmap G/B BITMAP.

Similarly, when the controller 130 stores the log data generated in correspondence to accesses to the memory blocks PLANE<0:3>*2*{N+1} in the memory device 150, in the fourth super blocks BAD+SUPERBLOCK2 (1303), the log data should be stored in only the good memory blocks of the fourth super blocks BAD+SUPERBLOCK2.

Therefore, the controller 130 quickly and accurately checks where good memory blocks are located through the state bitmap G/B BITMAP of the fourth super blocks BAD+SUPERBLCOK2 for storing the log data.

In this way, the controller 130 stores the log data in only the good memory blocks of the fourth super blocks BAD+SUPERBLOCK2 as a result of checking the state bitmap G/B BITMAP.

FIGS. 10 to 18 are diagrams schematically illustrating exemplary applications of the data processing system of FIG. 1 in accordance with various embodiments of the present invention.

Figure 10:
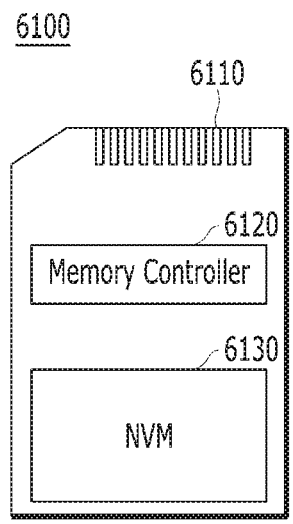
FIGS. 10 to 18 are schematic illustrations of applications of the data processing system shown in FIG. 1 in accordance with various embodiments of the present invention.

FIG. 10 is a diagram schematically a data processing system including the memory system in accordance with an embodiment of the present invention. FIG. 10 schematically illustrates a memory card system to which the memory system may be applied.

Referring to FIG. 10, the memory card system 6100 may include a memory controller 6120, a memory device 6130 and a connector 6110.

More specifically, the memory controller 6120 may be connected to the memory device 6130 embodied by a nonvolatile memory, and configured to access the memory device 6130. For example, the memory controller 6120 may be configured to control read, write, erase and background operations of the memory device 6130. The memory controller 6120 may be configured to provide an interface between the memory device 6130 and a host, and drive firmware for controlling the memory device 6130. That is, the memory controller 6120 may correspond to the controller 130 of the memory system 110 described with reference to FIGS. 1 and 7, and the memory device 6130 may correspond to the memory device 150 of the memory system 110 described with reference to FIGS. 1 and 7.

Thus, the memory controller 6120 may include a RAM, a processor, a host interface, a memory interface and an error correction component. The memory controller 130 may further include the elements shown in FIG. 7.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system may be applied to wired/wireless electronic devices, particularly mobile electronic devices.

The memory device 6130 may be implemented by a nonvolatile memory. For example, the memory device 6130 may be implemented by any of various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 7.

The memory controller 6120 and the memory device 6130 may be integrated into a single semiconductor device. For example, the memory controller 6120 and the memory device 6130 may be so integrated to form a solid state driver (SSD) or a memory card such as a PC card (PCMCIA: Personal Computer Memory Card International Association), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 11:
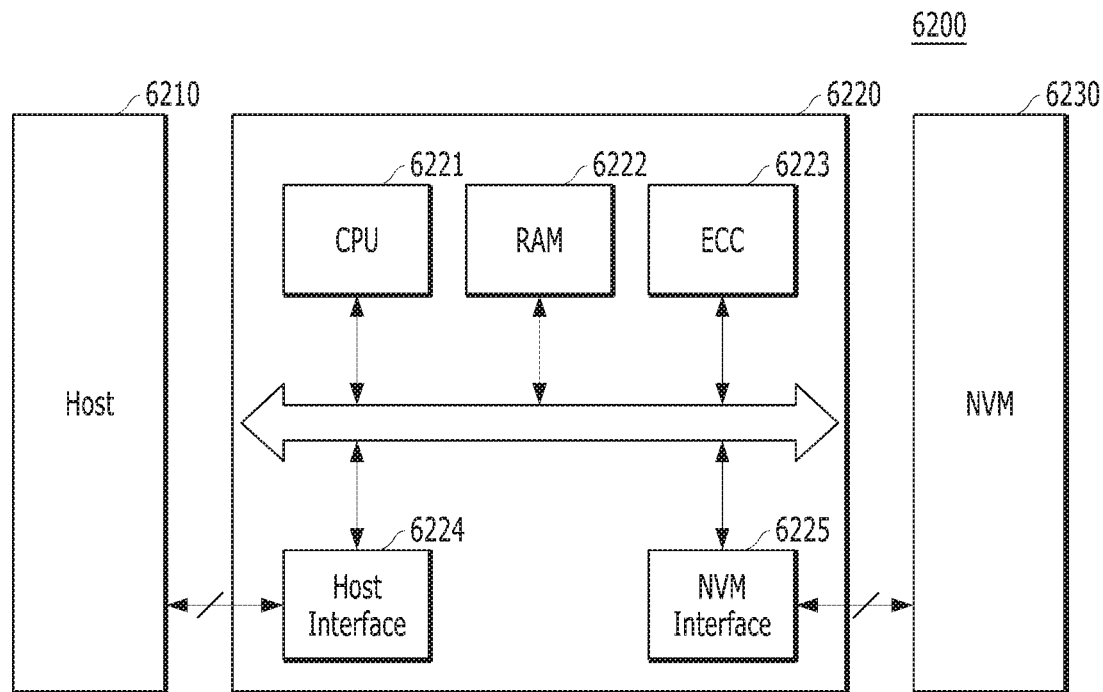

FIG. 11 is a diagram schematically illustrating a data processing system including the memory system in accordance with another embodiment of the present invention.

Referring to FIG. 11, the data processing system 6200 may include a memory device 6230 having one or more nonvolatile memories and a memory controller 6220 for controlling the memory device 6230. The data processing system 6200 illustrated in FIG. 11 may serve as a storage medium such as a memory card (CF, SD, micro-SD or the like) or USB device, as described with reference to FIG. 1. The memory device 6230 may correspond to the memory device 150 in the memory system 110 illustrated in FIGS. 1 and 7, and the memory controller 6220 may correspond to the controller 130 in the memory system 110 illustrated in FIGS. 1 and 7.

The memory controller 6220 may control a read, write or erase operation on the memory device 6230 in response to a request of the host 6210, and the memory controller 6220 may include one or more CPUs 6221, a buffer memory such as RAM 6222, an ECC circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC component 138 of the controller 130 illustrated in FIG. 1. As described with reference to FIG. 1, the ECC circuit 6223 may generate an ECC (Error Correction Code) for correcting a failed bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. The ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224, and transmit/receive data to/from the memory device 6230 through the NVM interface 6225. The host interface 6224 may be connected to the host 6210 through a PATA bus, SATA bus, SCSI, USB, PCIe or NAND interface. The memory controller 6220 may have a wireless communication function with a mobile communication protocol such as WiFi or Long Term Evolution (LTE). The memory controller 6220 may be connected to an external device, for example, the host 6210 or another external device, and then transmit/receive data to/from the external device. In particular, as the memory controller 6220 is configured to communicate with the external device through one or more of various communication protocols, the memory system and the data processing system may be applied to wired/wireless electronic devices or particularly a mobile electronic device.

Figure 12:
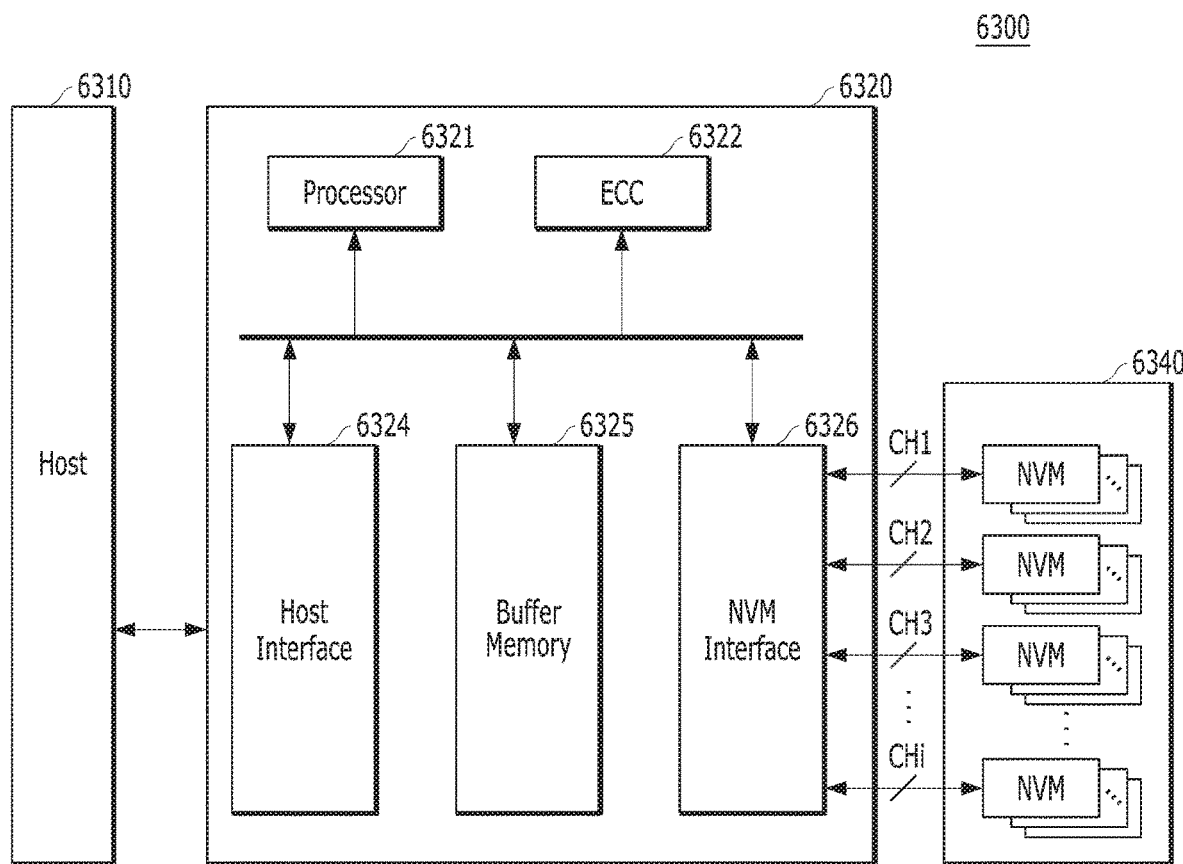

FIG. 12 is a diagram schematically illustrating a data processing system including the memory system in accordance with another embodiment of the present invention. FIG. 12 schematically illustrates an SSD to which the memory system may be applied.

Referring to FIG. 12, the SSD 6300 may include a controller 6320 and a memory device 6340 including a plurality of nonvolatile memories. The controller 6320 may correspond to the controller 130 in the memory system 110 of FIGS. 1 and 7, and the memory device 6340 may correspond to the memory device 150 in the memory system of FIGS. 1 and 7.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as DRAM, SDRAM, DDR SDRAM, LPDDR SDRAM and GRAM or nonvolatile memories such as FRAM, ReRAM, STT-MRAM and PRAM. By way of example, FIG. 11 illustrates that the buffer memory 6325 is disposed in the controller 6320. However, the buffer memory 6325 may be external to the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIGS. 1 and 7 is applied may be provided to embody a data processing system, for example, RAID (Redundant Array of Independent Disks) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 13:
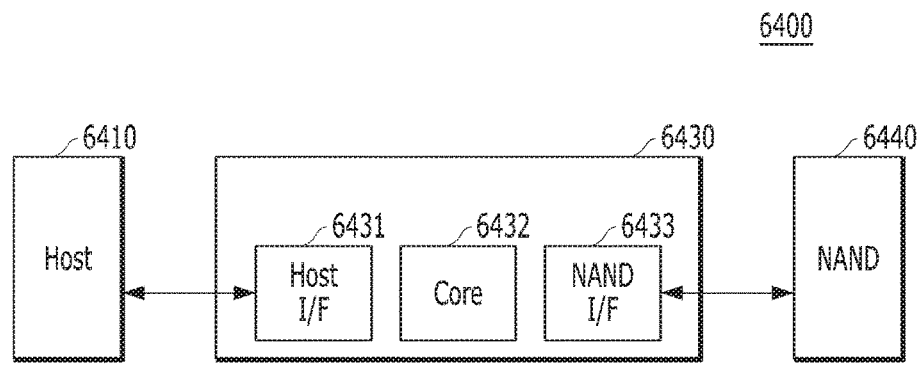

FIG. 13 is a diagram schematically illustrating a data processing system including the memory system in accordance with another embodiment of the present invention. FIG. 13 schematically illustrates an embedded Multi-Media Card (eMMC) to which the memory system may be applied.

Referring to FIG. 13, the eMMC 6400 may include a controller 6430 and a memory device 6440 embodied by one or more NAND flash memories. The controller 6430 may correspond to the controller 130 in the memory system 110 of FIGS. 1 and 7, and the memory device 6440 may correspond to the memory device 150 in the memory system 110 of FIGS. 1 and 7.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, UHS ((Ultra High Speed)-I/UHS-II) interface.

FIGS. 14 to 17 are diagrams schematically illustrating other data processing systems, each including the memory system in accordance with embodiments of the present invention. FIGS. 14 to 17 schematically illustrate UFS (Universal Flash Storage) systems to which the memory system may be applied.

Referring to FIGS. 14 to 17, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired/wireless electronic devices or particularly mobile electronic devices, the UFS devices 6520, 6620, 6720 and 6820 may serve as embedded UFS devices, and the UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired/wireless electronic devices or particularly mobile electronic devices through UFS protocols, and the UFS devices 6520, 6620, 6720 and 6820 and the UFS cards 6530, 6630, 6730 and 6830 may be embodied by the memory system 110 illustrated in FIGS. 1 and 7. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 11 to 13, and the UFS cards 6530, 6630, 6730 and 6830 may be embodied in the form of the memory card system 6100 described with reference to FIG. 10.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720 and 6820 and the UFS cards 6530, 6630, 6730 and 6830 may communicate with each other through various protocols other than the UFS protocol, for example, UFDs, MMC, SD, mini-SD, and micro-SD.

Figure 14:
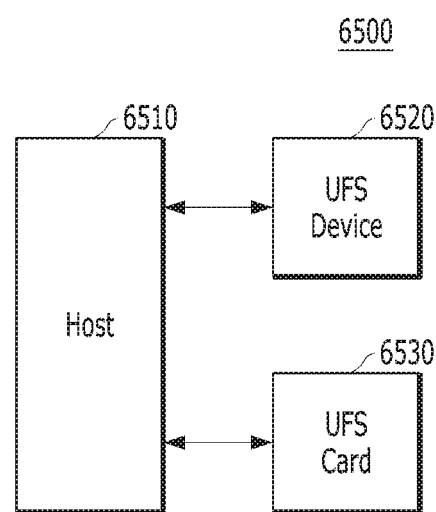

In the UFS system 6500 illustrated in FIG. 14, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. The UFS device 6520 and the UFS card 6530 may communicate with each other through link layer switching at the UniPro of the host 6510. In FIG. 14, the configuration in which one UFS device 6520 and one UFS card 6530 are connected to the host 6510 is illustrated as an example. However, a plurality of UFS devices and UFS cards may be connected in parallel or in the form of a star to the host 6410, and a plurality of UFS cards may be connected in parallel or in the form of a star to the UFS device 6520 or connected in series or in the form of a chain to the UFS device 6520.

Figure 15:
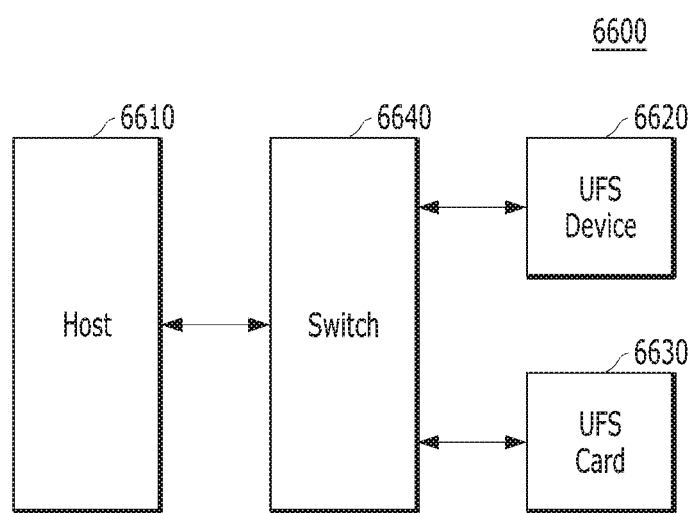

In the UFS system 6600 illustrated in FIG. 15, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In FIG. 15, the configuration in which one UFS device 6620 and one UFS card 6630 are connected to the switching module 6640 is illustrated as an example. However, a plurality of UFS devices and UFS cards may be connected in parallel or in the form of a star to the switching module 6640, and a plurality of UFS cards may be connected in series or in the form of a chain to the UFS device 6620.

Figure 16:
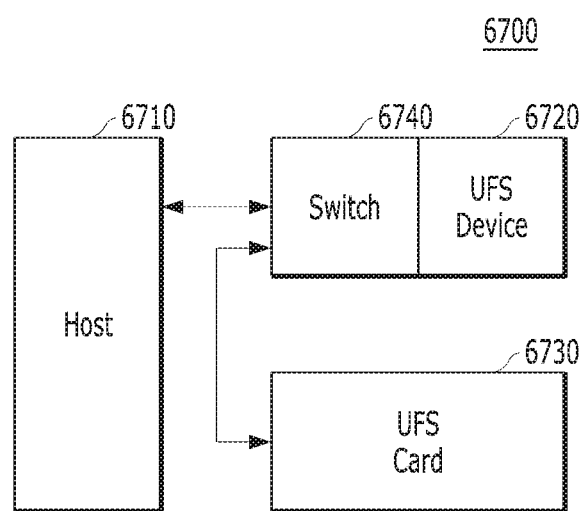

In the UFS system 6700 illustrated in FIG. 16, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. The UFS device 6720 and the UFS card 6730 may communicate with each other through link layer switching of the switching module 6740 at the UniPro, and the switching module 6740 may be integrated as one module with the UFS device 6720 inside or outside the UFS device 6720. In FIG. 16, the configuration in which one UFS device 6720 and one UFS card 6730 are connected to the switching module 6740 is illustrated as an example. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 17:
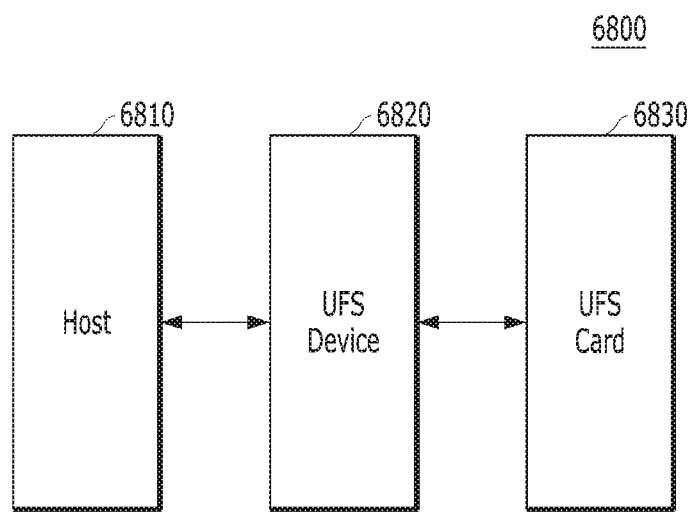

In the UFS system 6800 illustrated in FIG. 17, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. The host 6810 and the UFS card 6830 may communicate with each other through target ID switching between the M-PHY and UniPro modules of the UFS device 6820. In FIG. 17, the configuration in which one UFS device 6820 is connected to the host 6810 and one UFS card 6830 is connected to the UFS device 6820 is illustrated as an example. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 18:
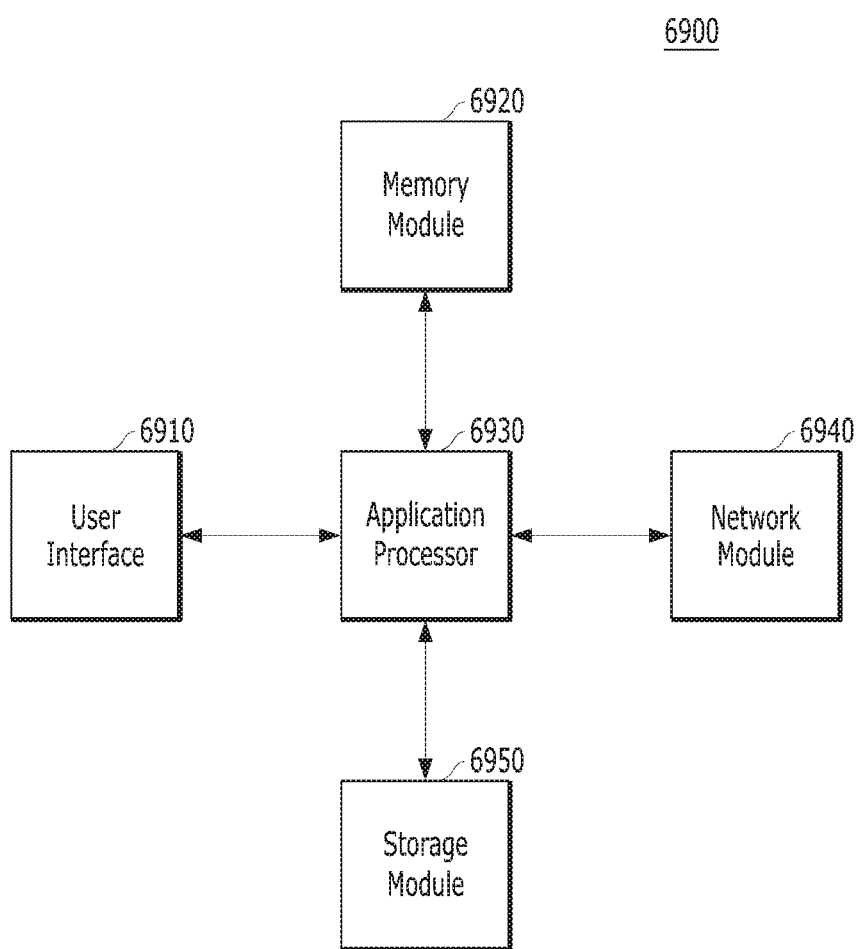

FIG. 18 is a diagram schematically illustrating a data processing system including the memory system in accordance with an embodiment of the present invention. FIG. 18 illustrates a user system to which the memory system may be applied.

Referring to FIG. 18, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile RAM such as DRAM, SDRAM, DDR SDRAM, DDR2 SDRAM, DDR3 SDRAM, LPDDR SDARM, LPDDR3 SDRAM or LPDDR3 SDRAM or a nonvolatile RAM such as PRAM, ReRAM, MRAM or FRAM. For example, the application processor 6930 and the memory module 6920 may be packaged and mounted, based on POP (Package on Package).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIGS. 1 and 7. Furthermore, the storage module 6950 may be embodied as an SSD, eMMC and UFS as described above with reference to FIGS. 12 to 17.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIGS. 1 and 7 is applied to a mobile electronic device of the user system 6900, the application processor 6930 may control overall operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

In accordance with embodiments of the present invention, a plurality of memory blocks in a memory device are effectively managed by grouping them into super memory blocks Different super blocks may contain different groupings of memory blocks and different numbers of bad memory blocks, and as result be managed differently. One such super memory block has at least one bad memory block and good memory blocks mixed and grouped for purpose of managing the blocks. In this regard, a particular super memory block is managed based on the number of bad memory blocks grouped with good memory blocks.

As a consequence, the storage space of a memory system may be efficiently used, and through this, the sustainability of the memory system may be significantly increased.

Although various embodiments have been described and illustrated, it will be apparent to those skilled in the art that various changes and modifications may be made without departing from the spirit and scope of the invention as defined in the following claims.

What is claimed is:

1. A memory system comprising:
a memory device including a plurality of memory blocks; and
a controller suitable for grouping the memory blocks based on type into a plurality of super blocks according to a preset condition and managing the memory blocks by managing the super blocks,
wherein the controller manages one or more of the super blocks, in each of which at least one bad memory block and good memory blocks are grouped, by classifying the one or more superblocks as first super blocks, and
wherein the controller differently manages uses of the respective first super blocks based on the numbers of bad memory blocks included in the respective first super blocks.

2. The memory system according to claim 1,
wherein the controller manages remaining super blocks in each of which only good memory blocks are grouped, by classifying them as second super blocks, among the plurality of super blocks,
wherein the controller manages first super blocks, each of which includes a number of bad memory block which is equal to or less than a preset number, among the first super blocks, by classifying them as third super blocks, and
wherein the controller manages first super blocks, each of which includes a number of bad memory blocks which exceeds the preset number, among the first super blocks, by classifying them as fourth super blocks.

3. The memory system according to claim 2,
wherein the controller stores normal write data in the second super blocks,
wherein the controller stores map data of the stored write data in the third super blocks, and
wherein the controller stores log data representing accesses to the memory blocks in the fourth super blocks.

4. The memory system according to claim 2,
wherein the controller stores data to be written during a foreground operation in the second super blocks,
wherein the controller stores data to be written during a background operation in the third super blocks, and
wherein the controller stores log data representing accesses to the memory blocks in the fourth super blocks.

5. The memory system according to claim 2,
wherein the controller programs memory cells in the second super blocks in a program scheme for a multi-level cell, and
wherein the controller programs memory cells in the third super blocks and the fourth super blocks in a program scheme for a single level cell.

6. The memory system according to claim 2,
wherein the controller programs memory cells in the second super blocks in a program scheme for a triple level cell,
wherein the controller programs memory cells in the third super blocks in a program scheme for a multi-level cell, and
wherein the controller programs memory cells in the fourth super blocks in a program scheme for a single level cell.

7. The memory system according to claim 2,
wherein the controller manages good/bad states of memory blocks in the third and fourth super blocks by a state bitmap, and
wherein, when storing data in the third or fourth super blocks, the controller stores the data in only good memory blocks of each of the third or fourth super blocks, which are identified by checking the state bitmap.

8. The memory system according to claim 2, wherein, in the case where at least one bad memory block is present in a select second super block among the second super blocks due to repetition of erase-write cycles, the controller moves valid data stored in the select second super block, to a target super block, through a merge operation, and then, manages the select second super block as a third or fourth super block.

9. The memory system according to claim 1,
wherein a first die, of dies in the memory device, is coupled to a first channel,
wherein a second die of the dies is coupled to a second channel,
wherein planes included in the first die are coupled to a plurality of first ways which share the first channel, and
wherein planes included in the second die are coupled to a plurality of second ways which share the second channel.

10. The memory system according to claim 9,
wherein the grouping of the memory blocks, by the controller, based on type into a plurality of super blocks according to the preset condition includes:
grouping a first block which is in a first plane of the first die and a second block which is in a second plane of the first die, and grouping a third block which is in a third plane of the second die and a fourth block which is in a fourth plane of the second die,
grouping a first block which is in a first plane of the first die and a third block which is in a third plane of the second die, and grouping a second block which is in a second plane of the first die and a fourth block which is in a fourth plane of the second di, or
grouping a first block which is in a first plane of the first die, a second block which is in a second plane of the first die, a third block which is in a third plane of the second die and a fourth block which is in a fourth plane of the second die.

11. A method for operating a memory system including a memory device including a plurality of memory blocks, the method comprising:

grouping the memory blocks based on type into a plurality of super blocks according to a preset condition, and managing the memory blocks by managing the super blocks;

managing one or more super blocks, in each of which at least one bad memory block and good memory blocks are grouped, by classifying them as first super blocks; and differently managing uses of the respective first super blocks based on the numbers of bad memory blocks included in the respective first super blocks.

12. The method according to claim 11, further comprising managing remaining super blocks, in each of which only good memory blocks are grouped, by classifying them as second super blocks, among the plurality of super blocks, wherein the managing of the remaining super blocks comprises:

managing first super blocks, each of which includes a number of bad memory blocks which is equal to or less than a preset number, among the first super blocks, by classifying them as third super blocks; and managing first super blocks, each of which includes a number of bad memory blocks which exceeds the preset number, among the first super blocks, by classifying them as fourth super blocks.

13. The method according to claim 12, further comprising:

storing normal write data in the second super blocks;

storing map data of the stored write data in the third super blocks; and storing log data representing accesses to the memory blocks in the fourth super blocks.

14. The method according to claim 12, further comprising:

storing data to be written during a foreground operation in the second super blocks;

storing data to be written during a background operation in the third super blocks; and storing log data representing accesses to the memory blocks in the fourth super blocks.

15. The method according to claim 12, further comprising:

programming memory cells in the second super blocks in a program scheme for a multi-level cell; and programming memory cells in the third super blocks and the fourth super blocks in a program scheme for a single level cell.

16. The method according to claim 12, further comprising:

programming memory cells in the second super blocks in a program scheme for a triple level cell, programming memory cells in the third super blocks in a program scheme for a multi-level cell, and programming memory cells in the fourth super blocks, in a program scheme for a single level cell.

17. The method according to claim 12, further comprising:

managing good/bad states of memory blocks in each of the third and fourth super blocks by a state bitmap; and storing, when storing data in the third or fourth super blocks, the data in only good memory blocks of each of the third or fourth super blocks, which are identified by checking the state bitmap.

18. The method according to claim 12, further comprising moving, when at least one bad memory block is present in a select second super block among the second super blocks due to repetition of erase-write cycles, valid data stored in the select second super block, to a target super block, through a merge operation, and then, managing the select second super block by classifying it as a third or fourth super block.

19. The method according to claim 11, wherein a first die, of dies in the memory device, is coupled to a first channel, wherein a second die of the dies is coupled to a second channel, wherein planes included in the first die are coupled to a plurality of first ways which share the first channel, and wherein planes included in the second die are coupled to a plurality of second ways which share the second channel.

20. The method according to claim 19, wherein the grouping according to the preset condition includes: grouping a first block which is in a first plane of the first die and a second block which is in a second plane of the first die, and grouping a third block which is in a third plane of the second die and a fourth block which is in a fourth plane of the second die;

grouping a first block which is in a first plane of the first die and a third block which is in a third plane of the second die, and grouping a second block which is in a second plane of the first die and a fourth block which is in a fourth plane of the second die; or grouping a first block which is in a first plane of the first die, a second block which is in a second plane of the first die, a third block which is in a third plane of the second die and a fourth block which is in a fourth plane of the second die.

* * * * *